(12) United States Patent
Arnaud Quinsat et al.

(10) Patent No.: US 11,232,822 B2
(45) Date of Patent: Jan. 25, 2022

(54) MAGNETIC MEMORY WITH CIRCUIT TO SUPPLY SHIFT PULSE TO MOVE A DOMAIN WALL IN A MAGNETIC BODY

(71) Applicant: KIOXIA CORPORATION, Tokyo (JP)

(72) Inventors: Michael Arnaud Quinsat, Yokohama Kanagawa (JP); Tsuyoshi Kondo, Kawasaki Kanagawa (JP); Masahiro Koike, Ota Tokyo (JP); Shiho Nakamura, Fujisawa Kanagawa (JP); Susumu Hashimoto, Nerima Tokyo (JP); Masaki Kado, Kamakura Kanagawa (JP); Nobuyuki Umetsu, Kawasaki Kanagawa (JP); Yasuaki Ootera, Yokohama Kanagawa (JP); Megumi Yakabe, Kawasaki Kanagawa (JP); Agung Setiadi, Tokyo (JP); Shigeyuki Hirayama, Kawasaki Kanagawa (JP); Yoshihiro Ueda, Yokohama Kanagawa (JP); Tsutomu Nakanishi, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/010,455

(22) Filed: Sep. 2, 2020

(65) Prior Publication Data
US 2021/0249061 A1    Aug. 12, 2021

(30) Foreign Application Priority Data
Feb. 7, 2020    (JP) .............................. JP2020-019893

(51) Int. Cl.
*G11C 11/16* (2006.01)
(52) U.S. Cl.
CPC ........ *G11C 11/161* (2013.01); *G11C 11/1655* (2013.01); *G11C 11/1657* (2013.01); *G11C 11/1673* (2013.01); *G11C 11/1675* (2013.01)
(58) Field of Classification Search
None
See application file for complete search history.

(56) References Cited

U.S. PATENT DOCUMENTS

| 9,153,340 B2 | 10/2015 | Morise et al. |
| 9,184,212 B2 | 11/2015 | Morise et al. |
| 9,236,106 B2 | 1/2016 | Nakamura |

(Continued)

FOREIGN PATENT DOCUMENTS

JP    6184680 B2    1/2016

*Primary Examiner* — J. H. Hur
(74) *Attorney, Agent, or Firm* — Kim & Stewart LLP

(57) ABSTRACT

According to one embodiment, a magnetic memory includes a magnetic body with two portions of a first dimension in a first direction which are spaced from each other a second direction and another portion that has a second dimension less than the first dimension in the first direction, which is between the two other portions. A circuit supplies a shift pulse to the magnetic body. The shift pulse includes a first pulse and a second pulse and moves a domain wall in the magnetic body along the second direction. The first pulse has a first pulse width. The second pulse has a second pulse width less than the first pulse width. The second pulse is supplied to the magnetic body after the first pulse.

13 Claims, 24 Drawing Sheets

(56) References Cited

U.S. PATENT DOCUMENTS

| | | | |
|---|---|---|---|
| 2008/0253161 A1* | 10/2008 | Parkin | G11C 19/0841 |
| | | | 365/80 |
| 2011/0096591 A1* | 4/2011 | Ohmori | G11C 11/1673 |
| | | | 365/158 |
| 2011/0129691 A1* | 6/2011 | Ishiwata | G11C 11/1675 |
| | | | 428/828 |
| 2012/0250406 A1* | 10/2012 | Morise | G11C 11/16 |
| | | | 365/173 |
| 2013/0235653 A1* | 9/2013 | Kondo | G11C 11/161 |
| | | | 365/158 |
| 2014/0119111 A1* | 5/2014 | Nakamura | G11C 11/161 |
| | | | 365/171 |
| 2015/0036422 A1* | 2/2015 | Morise | H01L 27/222 |
| | | | 365/158 |
| 2015/0262702 A1* | 9/2015 | Ootera | G11C 19/0808 |
| | | | 365/80 |
| 2016/0056368 A1* | 2/2016 | Parkin | G11C 11/1675 |
| | | | 438/3 |
| 2018/0254076 A1* | 9/2018 | Morise | G11C 11/1675 |
| 2021/0082483 A1* | 3/2021 | Takeda | G11C 11/1677 |

* cited by examiner

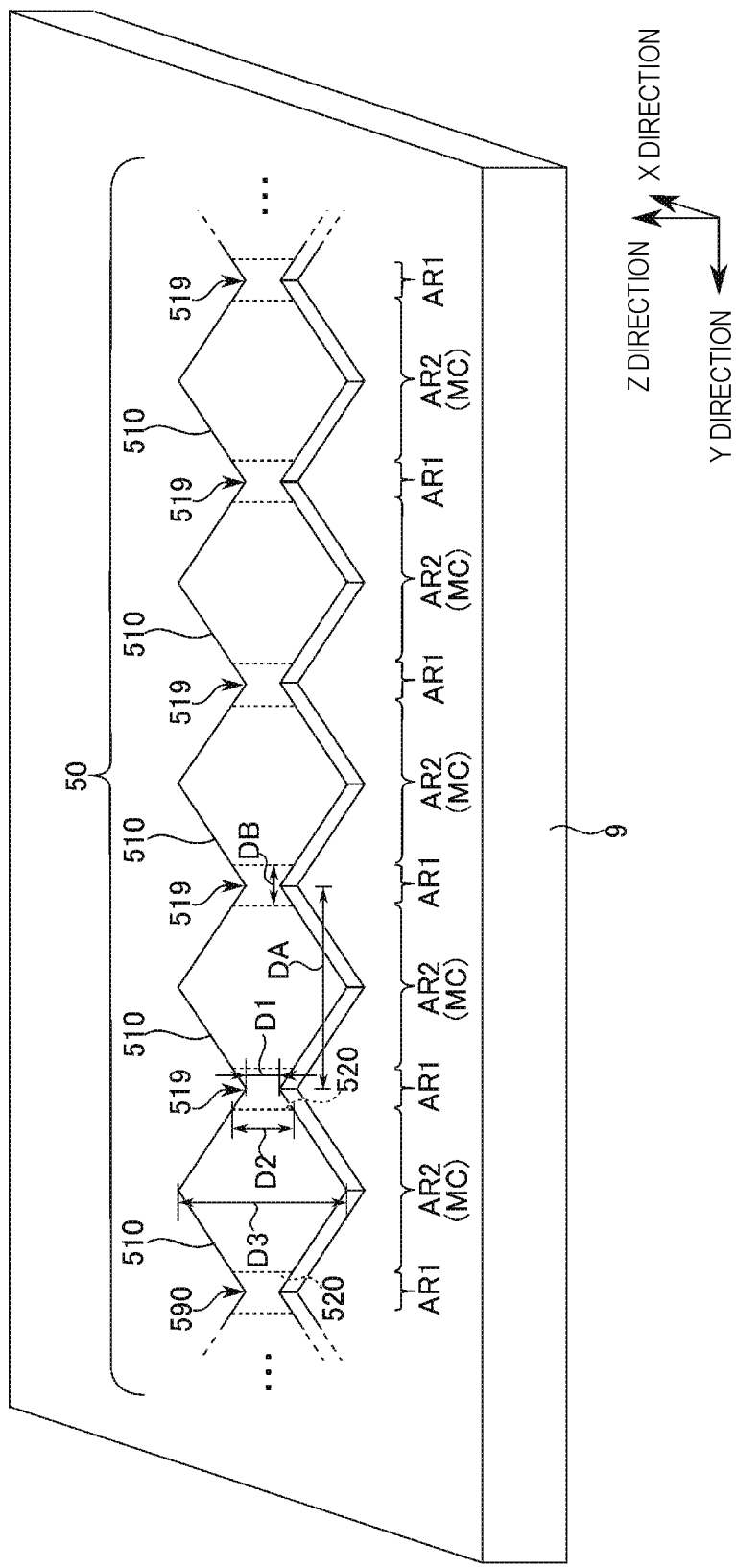

MAGNETIC MEMORY WITH CIRCUIT TO SUPPLY SHIFT PULSE TO MOVE A DOMAIN WALL IN A MAGNETIC BODY

CROSS-REFERENCE TO RELATED APPLICATION(S)

This application is based upon and claims the benefit of priority from. Japanese Patent Application No. 2020-019893, filed Feb. 7, 2020, the entire contents of which are incorporated herein by reference.

FIELD

Embodiments described herein relate generally to a magnetic memory.

BACKGROUND

Research and development of magnetic memories using magnetic materials has been performed. However, in general, the reliability of such magnetic memories needs to be improved.

BRIEF DESCRIPTION OF THE DRAWINGS

FIG. 5 is a diagram illustrating a modification example of a memory cell unit in a magnetic memory according to a first embodiment.

DETAILED DESCRIPTION

In general, according to one embodiment, a magnetic memory comprises a magnetic body including: a first portion that has a first dimension in a first direction, a second portion that has the first dimension and spaced from the first portion in a second direction, and a third portion that has a second dimension, which is greater than the first dimension, in the first direction. The third portion is between the first portion and the second portion in the second direction. A circuit is configured to supply a shift pulse to the magnetic body to move a domain wall in the magnetic body along the second direction. The shift pulse comprises a first pulse and a second pulse. The first pulse has a first pulse width. The second pulse has a second pulse width less than the first pulse width. The second pulse is after the first pulse in the shift pulse.

With reference to FIGS. 1 to 26, a magnetic memory of various example embodiments is described.

Hereinafter, with reference to the drawings, the certain non-limiting embodiments are more specifically described. In the following description, elements having the same function and configuration are denoted by use of the same reference symbols.

In the following description of embodiments, certain elements (for example, circuits, wirings, and various voltages and signals) having reference symbols incorporating suffixes of numbers or letters for distinction between different instances of the same element type will be described. When it is not necessary to distinguish between elements of the same element type in the description, the suffixes on such reference symbols may be omitted. The use of reference symbols without suffixes in such a context indicates the description is applicable to each element of the element type.

EXAMPLE EMBODIMENTS

(1) First Embodiment

With reference to FIGS. 1 to 14, a magnetic memory of the first embodiment and a control method thereof are described.

(a) Configuration Example

With reference to FIGS. 1 to 5, a configuration example of the magnetic memory of the first embodiment is described.

(a-1) Overall Configuration

Figure 1:
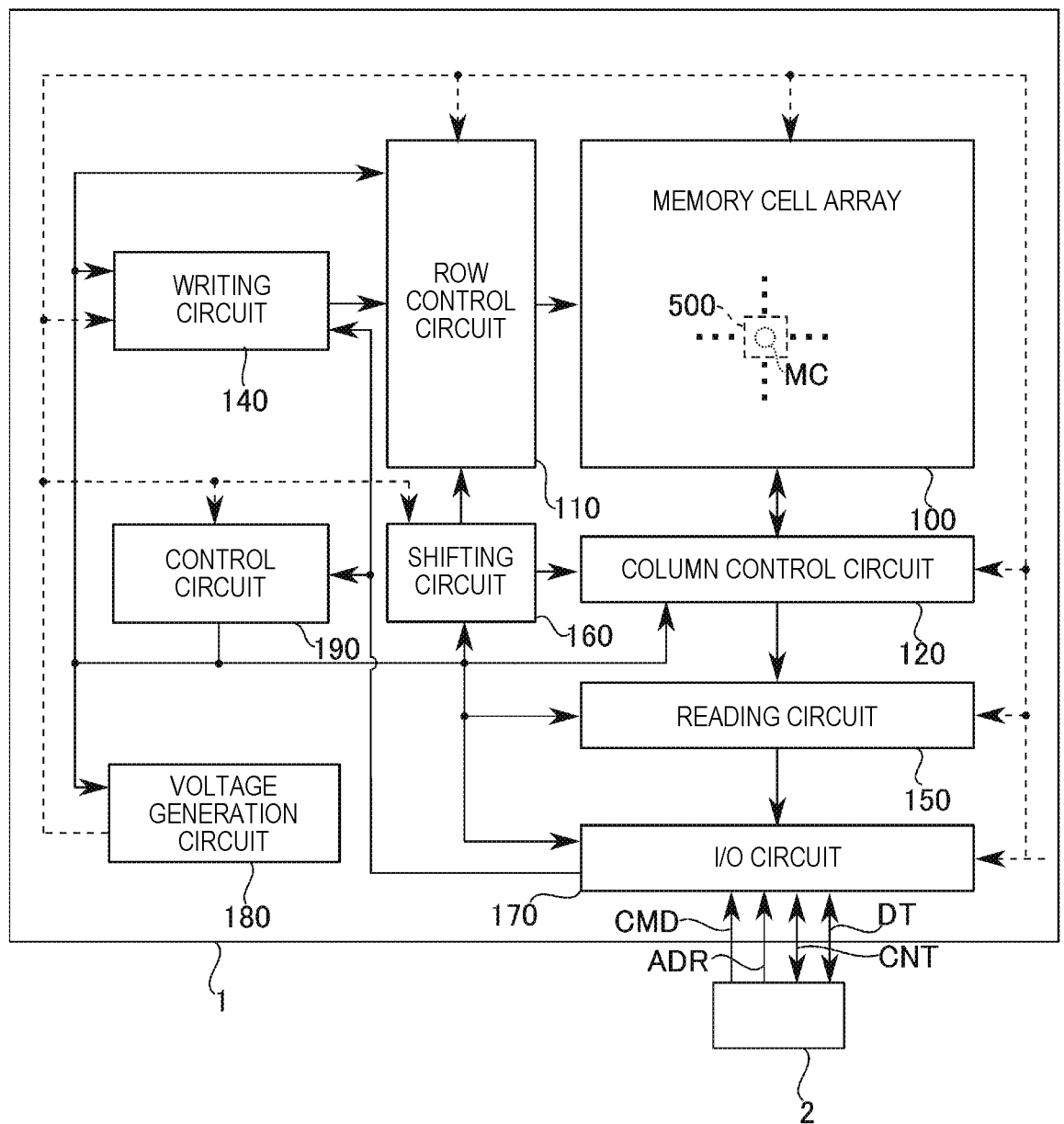
FIG. 1 is a diagram illustrating a configuration example of a magnetic memory according to a first embodiment.

FIG. 1 is a block diagram illustrating a configuration example of a magnetic memory of the first embodiment.

For example, a magnetic memory 1 of the first embodiment is a so-called "domain wall memory."

As illustrated in FIG. 1, the domain wall memory 1 of the first embodiment (also referred to as a domain wall shift memory) includes a memory cell array (100 (also referred to as a memory area), a row control circuit 110, a column control circuit 120, a writing circuit 140, a reading circuit 150, a shifting circuit 160, an I/O circuit 170, a voltage generation circuit 180, and a control circuit 190.

The memory cell array 100 includes a plurality of magnetic bodies 50 and a plurality of pieces of wiring. Each of the magnetic bodies 50 is connected to one or more pieces of corresponding wiring (for example, a word line and a bit line). The data is stored in memory cells MC via operations on the magnetic bodies 50.

The row control circuit 110 controls a plurality of rows of the memory cell array 100. A decoding result of an address (e.g., a row address) is supplied to the row control circuit 110. The row control circuit 110 sets a row (for example, a word line) based on the decoding result of the address to a selected state. Hereinafter, a row (or a word line) set to the selected state is referred to as a selected row (or a selected word line). A row except for the selected row is referred to as a non-selected row (or a non-selected word line).

For example, the row control circuit 110 includes a multiplexer (a word line selection circuit) and a word line driver and the like.

The column control circuit 120 controls a plurality of columns of the memory cell array 100. A decoding result of the address (the column address) from the control circuit 190 is supplied to the column control circuit 120. The column control circuit 120 sets a column (for example, at least one bit line) based on the decoding result of the address to a selected state. Hereinafter, a column (or a bit line) set to a selected state is referred to as a selected column (or a selected bit line). The column except for the selected column is referred to as a non-selected column (or a non-selected bit line).

The column control circuit 120 includes a multiplexer (also referred to as a bit line selection circuit), a bit line driver, and the like.

The writing circuit 140 (also referred to as a writing control circuit or a writing driver) performs various kinds of controls for a write operation (also referred to as writing data or data writing). During the write operation, the writing circuit 140 supplies a writing pulse formed by a current and/or a voltage to the memory cell array 100. Accordingly, the data is written in the memory cell array 100 to a memory cell.

For example, the writing circuit 140 is connected to the memory cell array 100 via the row control circuit 110.

The writing circuit 140 includes a voltage source and/or a current source, a pulse generation circuit, a latch circuit, and the like.

The reading circuit 150 (also referred to as reading control circuit or reading driver) performs various kinds of controls for a read operation (also referred to as reading data or data reading). During the read operation, the reading circuit 150 supplies a reading pulse (for example, a read current) to the memory cell array 100. The reading circuit 150 senses the voltage or the current value of the bit lines BL. The data in the magnetic bodies 50 is read based on the sensing result.

For example, the reading circuit 150 is connected to the memory cell array 100 via the column control circuit 120.

The reading circuit 150 includes a voltage source and/or a current source, a pulse generation circuit, a latch circuit, a sensing amplifier circuit, and the like.

The shifting circuit 160 (also referred to as a shift control circuit or a shift driver) performs various kinds of controls for a shift operation (referred to as shifting data or data shifting). During the shift operation, the shifting circuit 160 supplies a pulse (referred to as a shift pulse) for changing a domain wall (magnetic domain) in the magnetic bodies 50 to the memory cell array 100.

For example, the shifting circuit 160 is connected to the memory cell array 100 via the row control circuit 110 and the column control circuit 120.

The shifting circuit 160 includes a voltage source and/or a current source, a pulse generation circuit, and the like.

The writing circuit 140, the reading circuit 150, and the shifting circuit 160 are not limited to circuits that are independent from each other. For example, the writing circuit, the reading circuit, and the shifting circuit share a common element and may be disposed in the domain wall memory 1 as one integrated circuit.

The input and output (I/O) circuit 170 is an interface circuit for transmitting and receiving various kinds of signals.

During the write operation, the I/O circuit 170 transmits data DT from an external device 2 (e.g., a controller or a host device) to the writing circuit 140 as write data. During the read operation, the I/O circuit 170 transmits data output from the memory cell array 100 to the reading circuit 150, to the external device 2 as read data. The I/O circuit 170 transmits an address ADR and a command CMD from the external device 2 to the control circuit 190. The I/O circuit 170 transmits and receives various control signals CNT between the control circuit 190 and the external device 2.

The voltage generation circuit 180 generates voltage for various kinds of operations of the memory cell array 100 by using a supply voltage provided from the external device 2 (or a power supply). For example, during the write operation, the voltage generation circuit 180 outputs various voltages generated for the write operation to the writing circuit 140. During the read operation, the voltage generation circuit 180 outputs various voltages generated for the read operation to the reading circuit 150. During the shift operation, the voltage generation circuit 180 outputs various voltages generated for the shift operation to the shifting circuit 160.

The control circuit 190 (also referred to as a state machine, a sequencer, or an internal controller) controls an operation for each circuit in the domain wall memory 1 based on the control signals CNT, the address ADR, and the command CMD.

For example, the control circuit 190 has a command decoder, an address decoder, a latch circuit, and the like.

For example, the command CMD is a signal indicating an operation to be performed by the domain wall memory 1. For example, the address ADR is a signal indicating coordinates of one or more memory cells (referred to as selected cells) to be operated in the memory cell array 100. The address ADR includes a row address and a column address of the selected cell. For example, the control signals CNT are signals for controlling operation timings between the magnetic memory 1 and the external device 2 and operation timings inside the magnetic memory 1.

(a-2) Memory Cell Array

Figure 2:
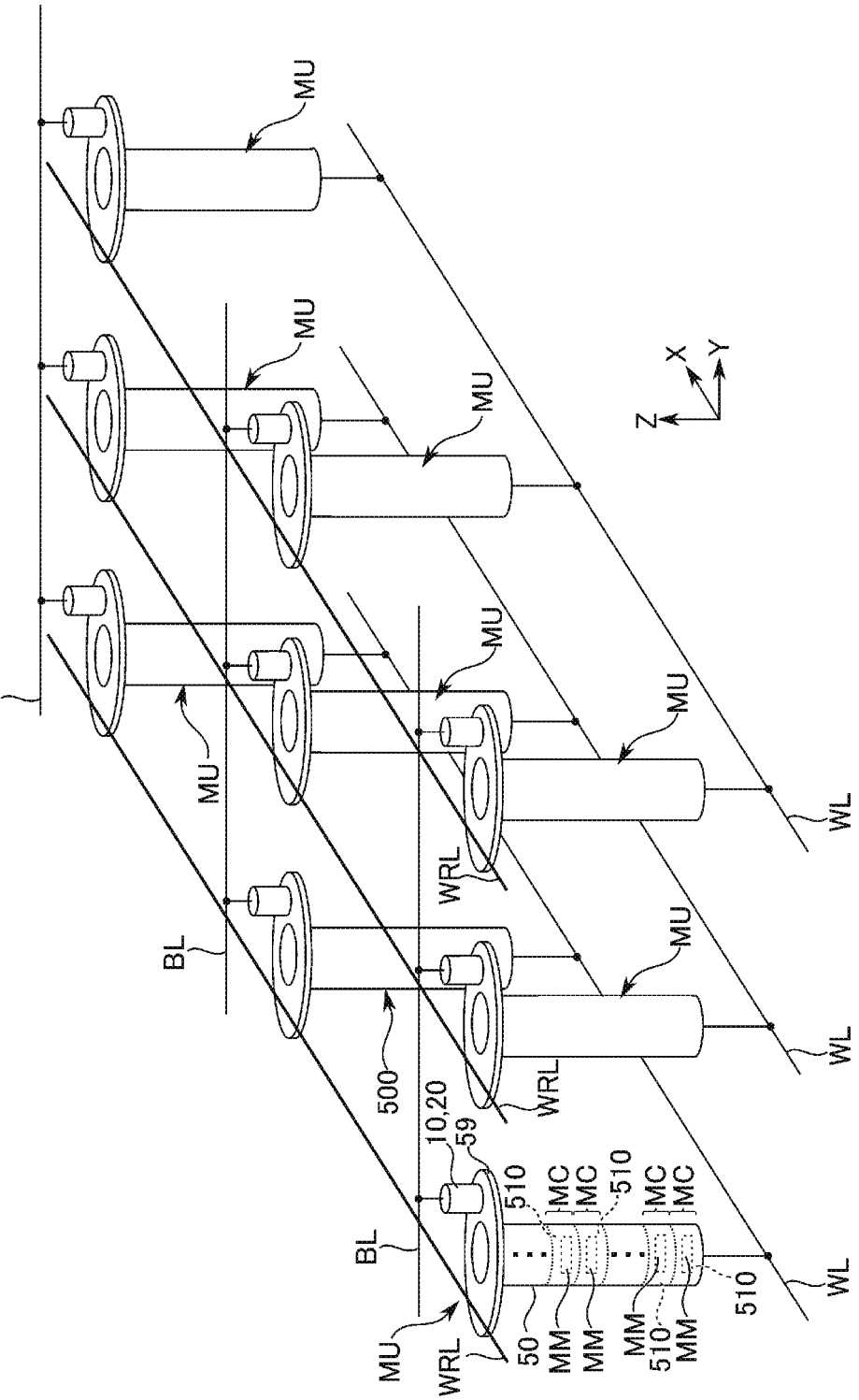
FIG. 2 is an equivalent circuit diagram illustrating a memory cell array in a magnetic memory according to a first embodiment.
Figure 3:
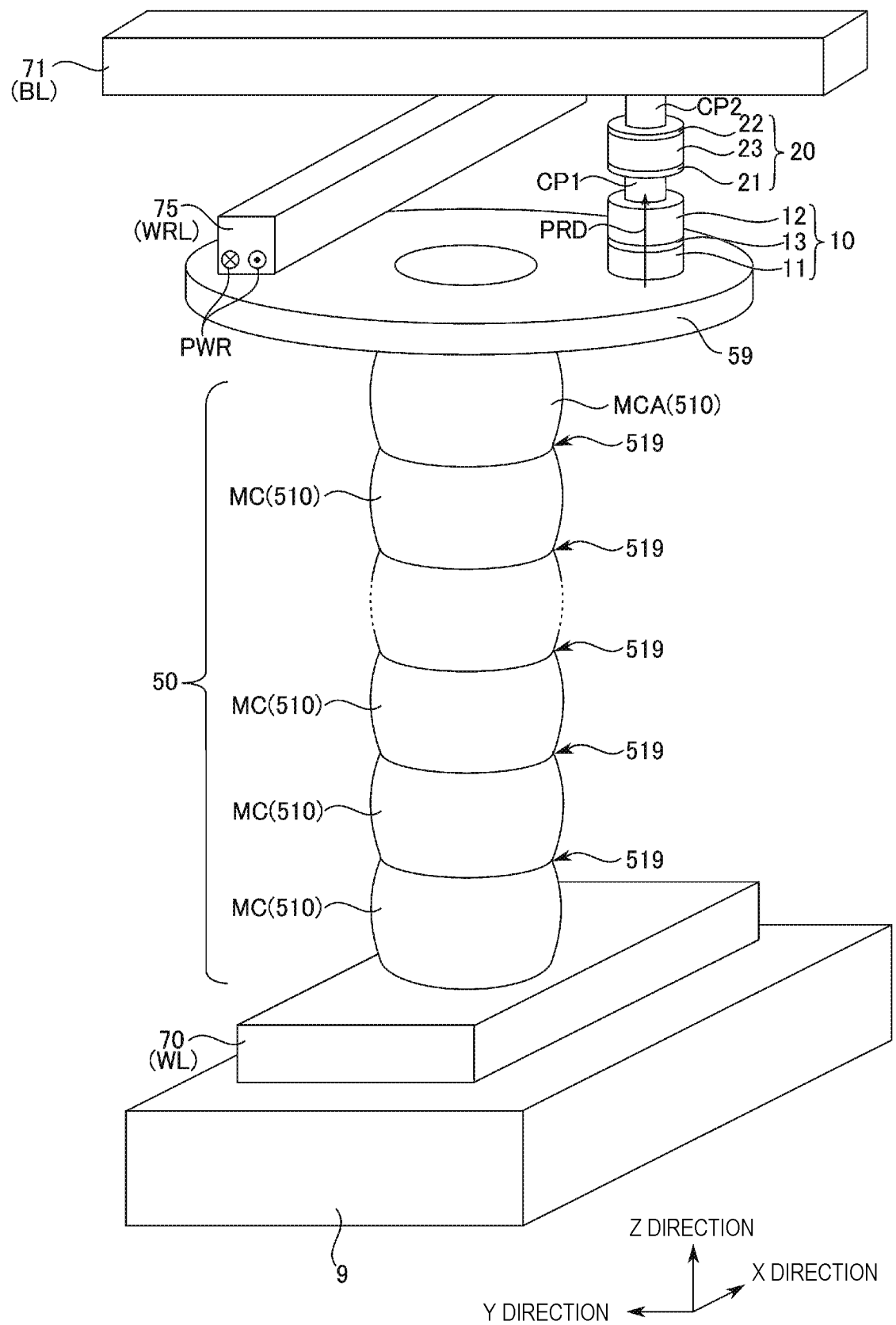
FIG. 3 is a perspective view illustrating aspects of a memory cell unit in a magnetic memory according to a first embodiment.
Figure 4:
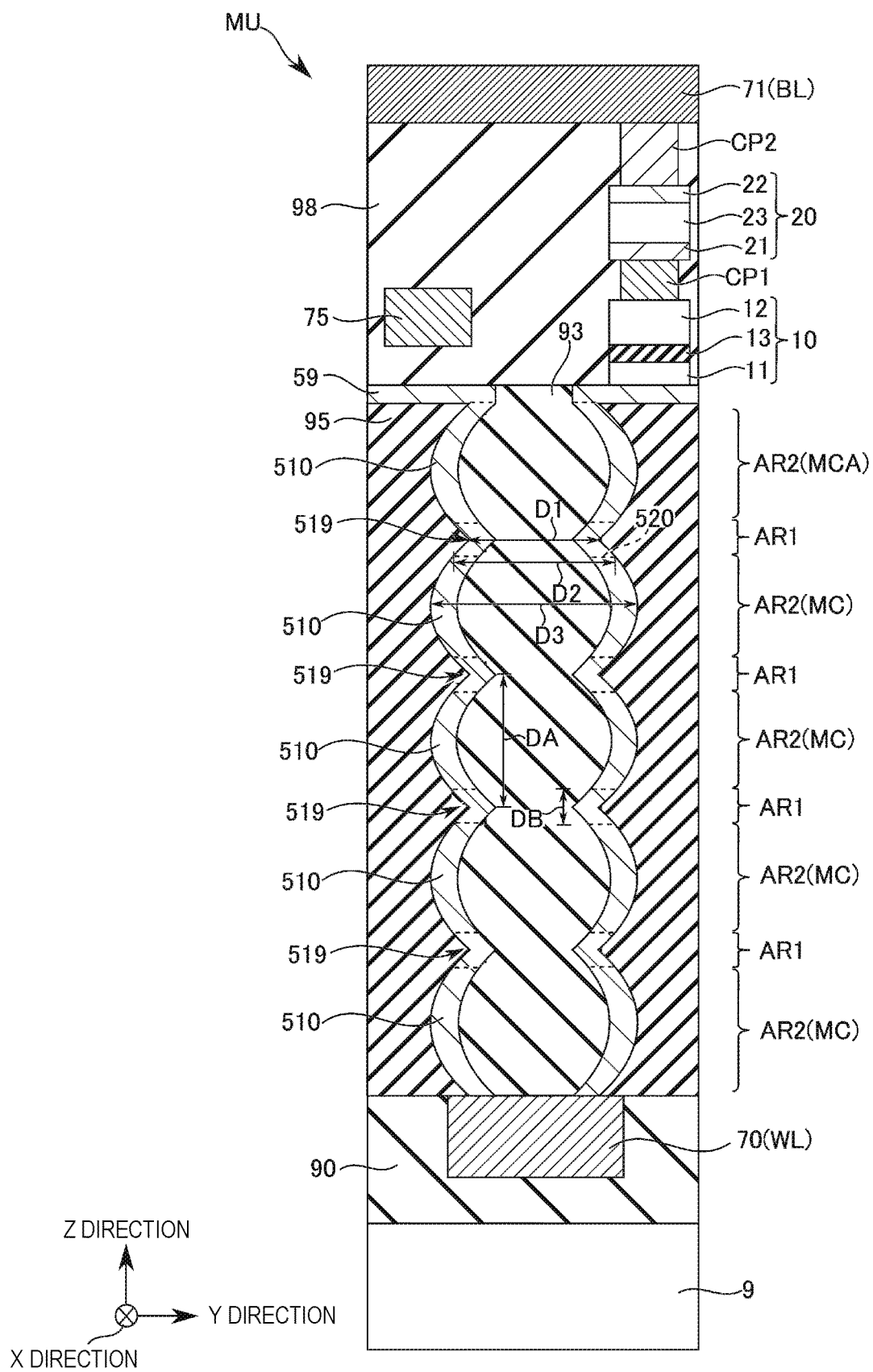
FIG. 4 is a cross-sectional view illustrating aspects of a memory cell unit in a magnetic memory according to a first embodiment.

With reference to FIGS. 2 to 4, a configuration example of the memory cell array of the domain wall memory according to the first embodiment is described.

FIG. 2 is a schematic view illustrating a configuration example of the memory cell array in the domain wall memory of the first embodiment.

As illustrated in FIG. 2, in the domain wall memory of the first embodiment, a plurality of magnetic bodies 50 are provided in the memory cell array 100.

A plurality of magnetic bodies 50 is two-dimensionally arranged within the memory cell array 100 on a substrate. Each of the magnetic bodies 50 extends in a perpendicular direction (Z direction) in relation to the upper surface of the substrate (X-Y plane).

A plurality of word lines WL and a plurality of bit lines BL are provided in the memory cell array 100. The plurality of word lines WL are spaced from each other along the Y direction. The word lines WL extend in the X direction. The plurality of bit lines BL are spaced from each other in the X direction. The bit lines BL extend in the Y direction.

In this example, the bit lines BL are provided above the word lines in the Z direction.

The magnetic bodies 50 are provided at positions corresponding to intersections (or crossing points) for the word lines WL and the bit lines BL. One end of each magnetic body 50 is connected to a word lines WL. The other end of each magnetic body 50 is connected to a bit line BL.

The magnetic bodies 50 aligned with each other along the X direction are connected to the same word line WL. The magnetic bodies 50 aligned with each other in the Y direction are connected to the same bit line BL.

In this example, reproducing elements 10 and switching elements 20 are connected between the bit lines BL and the magnetic bodies 50.

The reproducing elements 10 are between the magnetic bodies 50 and the switching elements 20. The reproducing elements 10 are electrically connected to the magnetic bodies 50 and the switching elements 20. For example, the reproducing elements 10 are connected to the magnetic bodies 50 via magnetic layers 59.

During the read operation of the domain wall memory 1, the reproducing elements 10 function as an element for reading data in the magnetic bodies 50 (and may thus be referred to as a reading element 10 in some contexts).

The switching elements 20 are provided between the reproducing elements 10 and the bit lines BL. The switching elements 20 are electrically connected to bit lines with the reproducing elements 10.

The switching elements 20 are used for controlling connections between the magnetic bodies 50 and the bit lines BL. When the switching elements 20 are set to the on state, the magnetic bodies 50 are electrically connected to the bit lines BL. When the switching elements 20 are set to the off state, the magnetic bodies 50 are electrically separated from the bit lines BL.

For example, the on and off states of the switching elements 20 are controlled by controlling potential differences between the bit lines BL and the word lines WL. Accordingly, one or more magnetic bodies 50 from among the plurality of magnetic bodies 50 of the memory cell array 100 can be selected (operated).

Conductive layers WRL (also referred to as wiring in some contexts) are provided above the magnetic layers 59 in the Z direction. For example, the conductive layers WRL extend in the X direction in areas between the bit lines BL and the magnetic layers 59. The conductive layers WRL extend over the plurality of magnetic layers 59.

During the write operation of the domain wall memory 1, the conductive layers WRL are wiring for writing data (and may be referred to as write wiring WRL) in the magnetic field writing method. During the write operation of the magnetic field writing method, the writing pulse (also referred to as a write current) is supplied to the write wiring WRL. By the write current, magnetic fields are generated around the write wiring WRL. The generated magnetic fields are applied to the magnetic layers 59. According to direction of the generated magnetic field, the direction of magnetization MM of the magnetic layer 59 and the magnetic body 50 connected to the magnetic layer 59 is set. Accordingly, the data is written in the magnetic bodies 50.

The direction of the magnetic field changes according to the direction in which the write current flows in the write wiring WRL. Therefore, the direction in which the write current flows in the write wiring WRL is set according to the data to be written.

A plurality of memory cells MC is provided in each of the magnetic bodies 50. The memory cells MC are arranged along the Z direction in the magnetic bodies 50. Accordingly, the memory cells MC are three-dimensionally arranged within the memory cell array 100.

Each of the memory cells MC includes cell portions 510 (also referred to as data storage portions). The cell portions 510 are areas (portions) in the magnetic bodies 50 that correspond to the memory cells MC. The cell portions 510 are magnetic areas (magnetic portions) that can have a magnetization MM.

When the memory cells MC store data, the cell portions 510 have the magnetization MM according to stored data. That is, the data stored in the memory cells MC is associated with the direction of the magnetization MM of the individual cell portions 510.

The magnetic bodies 50 have perpendicular magnetic anisotropy or in-plane magnetic anisotropy. The easy magnetization axis direction of the cell portions 510 depends on the magnetic anisotropy of the magnetic bodies 50.

Hereinafter, a configuration including memory cells MC, a reproducing element 10, and a switching element 20 in one magnetic body 50 is referred to as a memory cell unit (MU). Such a memory cell unit may also be referred to as a memory cell string).

(a-3) Memory Cell Unit

FIG. 3 is a schematic perspective view illustrating a structural example of the memory cell unit in the domain wall memory according to the first embodiment. FIG. 4 is a schematic cross-sectional view illustrating a structural example of the memory cell unit in the domain wall memory of the first embodiment.

As illustrated in FIGS. 3 and 4, the magnetic bodies 50 are provided above a substrate 9 in the Z direction. The magnetic body 50 comprises a magnetic layer (referred to as a domain wall moving layer). In this example, the magnetic body 50 is a magnetic layer that is a tube-like structure (for example, hollow cylinder-like structure) extending in the Z direction. The magnetic body 50 is, for example, between two insulators portions (insulator 93 and insulator 95) in directions parallel to the upper surface of the substrate 9. In some examples, insulator 93 may not be provided.

For example, the magnetic body 50 is a material including at least one element selected from the group consisting of cobalt (Co), iron (Fe), nickel (Ni), manganese (Mn), and chromium (Cr), and at least one element selected from the group consisting of platinum (Pt), palladium (Pd), iridium (Ir), ruthenium (Ru), and rhodium (Rh). More specifically, the material of the magnetic body 50 is CoPt, CoCrPt, FePt, CoPd, FePd, or the like. The material of the magnetic body 50 is not limited to the above material, and other magnetic materials may be used.

The magnetic layers 59 are provided at the upper end of the magnetic bodies 50 in the Z direction. For example, the magnetic layer 59 has a circular planar shape when viewed from the Z direction. The magnetic layer 59 may instead have a rectangular planar shape. The dimension of the magnetic layer 59 in the directions parallel the substrate 9 is larger than a dimension D3 of the magnetic body 50.

The magnetic layer 59 is connected to the magnetic body 50. For example, the magnetic layer 59 is a layer continuous with the magnetic body 50.

The magnetization of the magnetic layer 59 changes according to the magnetization of the magnetic body 50. For example, the direction of the magnetization of the magnetic layer 59 is the same as the direction of the magnetization of the cell portion 510 directly connected to the magnetic layer 59. The cell portion 510 directly connected to the magnetic layer 59 corresponds to the memory cell MCA positioned nearest to bit line among the plurality of memory cells in the memory cell unit MU.

The memory cell MCA functions as a reading cell during the read operation and functions as a writing cell during the write operation. In this context, the reading cell is a memory cell for storing data from a memory cell being read during the read operation. The writing cell is a memory cell in which write data is temporarily written during the write operation before transfer (movement) to another memory cell MC in the memory cell unit MU.

A stacked body including the reproducing elements 10 and the switching elements 20 is provided on the magnetic layer 59.

The reproducing element 10 is a magnetoresistive effect element.

The magnetoresistive effect element 10 is provided on the magnetic layer 59 in the Z direction. For example, the magnetoresistive effect element 10 is disposed at a position of not overlapping with the magnetic body 50 in the Z direction.

The magnetoresistive effect element 10 is disposed on one end side in the Y direction of the magnetic layer 59.

The magnetoresistive effect element 10 is electrically connected to the magnetic layer 59.

For example, the magnetoresistive effect element 10 includes two magnetic layers 11 and 12 and a nonmagnetic layer 13.

The nonmagnetic layer 13 is provided between the two magnetic layers 11 and 12 in the Z direction. The two magnetic layers 11 and 12 and the nonmagnetic layer 13 form a magnetic tunnel junction (MTJ). Hereinafter, the magnetoresistive effect element 10 including a magnetic tunnel junction is referred to as an MTJ element. The nonmagnetic layer 13 of the MTJ element 10 is referred to as a tunnel barrier layer.

For example, the magnetic layers 11 and 12 are ferromagnetic layers including cobalt, iron, boron, and the like. The magnetic layers 11 and 12 may be single-layer films or may be multilayer films (for example, artificial lattice films). The tunnel barrier layer 13 is, for example, an insulating film including magnesium oxide. The tunnel barrier layer may be single-layer films or may be multilayer films.

For example, each of the magnetic layers 11 and 12 has in-plane magnetic anisotropy or perpendicular magnetic anisotropy.

The easy magnetization axis direction of the magnetic layers 11 and 12 having the in-plane magnetic anisotropy is substantially parallel in relation to the layer surface (film surface) of the magnetic layer. Here, each of the magnetic layers 11 and 12 has substantially parallel magnetization in relation to the layer surfaces of the magnetic layers 11 and 12. The direction of the magnetization of the magnetic layers 11 and 12 having the in-plane magnetic anisotropy is perpendicular in relation to the arrangement direction (Z direction) of the magnetic layers 11 and 12.

The easy magnetization axis direction of the magnetic layers 11 and 12 having the perpendicular magnetic anisotropy is substantially perpendicular in relation to the layer surface (film surface) of the magnetic layer. Here, each of the magnetic layers 11 and 12 has substantially perpendicular magnetization in relation to the layer surfaces of the magnetic layers 11 and 12. The direction of the magnetization of the magnetic layers 11 and 12 having the perpendicular magnetic anisotropy is parallel in relation to the arrangement direction (Z direction) of the magnetic layers 11 and 12.

The direction of the magnetization of the magnetic layer 11 is variable. The direction of the magnetization of the magnetic layer 12 is invariant (fixed state). A magnetic layer 11 for which the direction of the magnetization is variable is also referred to as a storage layer 11. A magnetic layer 12 for which the direction of the magnetization is invariant (fixed) is also referred to as a reference layer 12. The storage layer 11 may also be referred to as a free layer, a magnetization free layer, or a magnetization variable layer. The reference layer 12 may be also referred to as a pin layer, a pinned layer, a magnetization invariant layer, or a magnetization fixed layer.

The direction of the magnetization of the storage layer 11 and the direction of the magnetization of the magnetic layer 59 changes in an interlocking manner. For example, the direction of the magnetization of the storage layer 11 is the direction of the magnetization of the magnetic layer 59.

The magnetic layer 59 may be used as a storage layer of the MTJ element 10. Here, without disposing the magnetic layer 11, the nonmagnetic layer 13 is provided on the magnetic layer 59 to be directly in contact with the magnetic layer 59.

The expression "a direction of magnetization of a reference layer (magnetic layer) is invariant" or the expression "a direction of magnetization of a reference layer (magnetic layer) is fixed state" means that, when a current, a voltage, or a magnetic energy (for example, a magnetic field) that changes a direction of magnetization of a storage layer is supplied to the magnetoresistive effect element 10, the direction of the magnetization of the reference layer does not change before or after the supply of the current, the voltage, or the magnetic energy.

The switching element 20 is provided above the MTJ element 10 in the Z direction.

For example, the switching element 20 is electrically connected to the MTJ element 10 via a contact plug CP1 (or a conductive layer). Without interposing other members, the switching element 20 may be directly connected to the MTJ element 10.

For example, the switching element 20 includes two electrodes 21 and 22 and a switching layer 23. The switching layer 23 is provided between the two electrodes 21 and 22. The electrode 21 is provided on the contact plug CP1 in the Z direction. The switching layer 23 is provided on the electrode 21 in the Z direction. The electrode 22 is provided on the switching layer 23 in the Z direction. The material of the switching layer 23 is transition metal oxide, a chalcogenide compound, or the like.

The switching element 20 switches the electrical connection with the memory cell unit MU and the bit line BL. As a result, activation or deactivation (selection or deselection) of the memory cell unit MU can be controlled.

The resistance state of the switching layer 23 changes to a high resistance state or a low resistance state according to the supplied current (or the voltage).

Accordingly the switching element 20 is set to the on state (a low resistance state or a conductive state) when a current equal to or more than the threshold current (or a voltage equal to or more than a threshold voltage) of the switching element 20 is supplied to the memory cell unit MU. The switching element 20 is set to the off state (high resistance state or electrically non-connected state) when the current less than the threshold current of the switching element 20 is supplied to the memory cell unit MU.

The switching element 20 in the off state electrically separates the memory cell unit MU from the bit line BL.

The switching element 20 in the on state can flow the current into the memory cell MC. The switching element 20 in the on state supplies a current flowing from the bit line BL side to the word line WL side or a current flowing from the word line WL side to the bit line BL side to the memory cell unit MU according to the potential difference between the bit line BL and the word line WL. As such, the switching element 20 is an element that can cause the current to flow to the memory cell unit MU in both directions.

A conductive layer 70 is provided between the magnetic body 50 and the substrate 9. The conductive layer 70 is provided on an insulating layer 90 that covers the upper surface of the substrate 9. For example, the conductive layer 70 is embedded in a groove of the insulating layer 90. The conductive layer 70 extends in the X direction. The magnetic layer or the conductive layer may be provided between the conductive layer 70 and the magnetic body 50.

The conductive layer 70 is used as the word lines WL. The conductive layer 70 as the word line WL is electrically connected to the row control circuit 110. The activation or deactivation (selection or deselection) of the word line WL is controlled by the row control circuit 110.

A conductive layer 71 is provided above the switching element 20 in the Z direction. The conductive layer 71 is electrically connected to the switching element 20 via a contact plug CP2. The conductive layer 71 extends in the Y direction.

The conductive layer 71 is used as the bit line BL. The conductive layer 71 used as the bit line BL is electrically connected to the column control circuit 120. The activation or deactivation (selection or deselection) of the bit line BL is controlled by the column control circuit 120.

A conductive layer 75 is provided in an insulating layer 98 between the magnetic layer 59 and the bit line BL. The conductive layer 75 is adjacent to the stacked body including the MTJ element 10 and the switching element 20 in the Y direction. The conductive layer 75 extends in the X direction.

The conductive layer 75 is used as the write wiring WRL. The conductive layer 75 as the write wiring is electrically connected to the row control circuit 110 and the writing circuit 140. The activation or deactivation of the write wiring 75 is controlled by the row control circuit 110. The supply of a write current PWR to the write wiring WRL is controlled by the writing circuit 140.

As illustrated in FIGS. 3 and 4, the dimension (for example, the diameter of the tubular magnetic layer) of the magnetic body 50 in the parallel direction (the X direction or the Y direction) in relation to the upper surface of the substrate 9 periodically changes along the Z direction. The magnetic body 50 is constricted (reduced in size) at a predetermined interval (period) along the Z direction.

The structure having a periodic dimension change (periodical constriction) is referred to as a constriction structure.

A portion 519 in which the magnetic body 50 is constricted is referred to as a recess portion 519 (or a constriction portion 519).

The range (area) AR1 including the recess portion 519 and having a certain dimension in the Z direction is referred to as a constriction area AR1 (or a domain wall presence area AR1). For example, the constriction areas AR1 is an area having a certain range with the recess portion 519 as a center. The recess portion 519 is an area having a certain dimension. Therefore, the constriction areas AR1 may be regarded as the recess portion 519.

A dimension D1 (a diameter of the tubular portion) of the recess portion 519 in the parallel direction (the X direction or the Y direction) in relation to the upper surface of the substrate is smaller than a portion other than the recess portion 519 in the constriction areas AR1. The end portion 520 is provided at the terminal end of the constriction areas AR1 in the Z direction. For example, a dimension D2 (for example, a diameter of the tubular portion) of the end portion 520 in the X direction (or the Y direction) is larger than the dimension D1.

The dimension D1 is the minimum dimension of the magnetic body 50 of the constriction structure in the X direction (or the Y direction).

The magnetic body 50 includes the plurality of portions 510. One of the portions 510 is provided between two of the recess portions 519 arranged in the Z direction. The portions 510 project toward the outside of the tubular magnetic body in a parallel direction in relation to the upper surface of the substrate 9 relative to the recess portions 519. Hereinafter, the portion 510 is also referred to as the protrusion 510.

The protrusion 510 substantially corresponds to the cell portion of the memory cell MC.

The protrusion 510 is provided in an area AR2 between two of the constriction areas AR1 in the magnetic body 50. Hereinafter, the area (range) AR2 between two of the constriction areas AR1 is also referred to as a cell area (a magnetization area or a domain wall moving area) AR2.

One of the protrusions 510 is provided between two of the recess portions 519 in the Z direction. The recess portion 519 (the constriction area AR1) substantially corresponds to a boundary portion of the adjacent cell portion 510 (the memory cell MC) in the Z direction.

The protrusion 510 has a dimension D3 (a diameter of the tubular portion) in the parallel direction (the X direction or the Y direction) in relation to the upper surface of the substrate 9. The dimension D3 of the protrusion 510 is larger than the dimension D1 of the recess portion 519. For example, the dimension D3 is the maximum dimension of the magnetic bodies 50 of the constriction structure in the X direction (or the Y direction). The dimension D3 of the center portion of the cell area AR2 is larger than the dimension D2 of the end portion 520.

The dimension D3 is larger than the dimensions D1 and D2.

The dimension of the cell area AR2 in the X direction (or the Y direction) gradually decreases from the center portion of the cell area AR2 to the recess portion 519. The volume of the magnetic body (the magnetic layer) in the constriction area AR1 is smaller than the volume of magnetic body in the cell area AR2.

Each of the cell portions 510 (the cell areas AR2) in one of the magnetic body 50 has magnetization (a magnetic domain).

For example, the magnetic body 50 has perpendicular magnetic anisotropy. The film surface (the layer surface) of the tubular magnetic body 50 is formed in a direction parallel to the Z direction. Therefore, the easy magnetization axis direction of the magnetic body 50 having perpendicular magnetic anisotropy intersects to the Z direction. When the magnetic body 50 has perpendicular magnetic anisotropy, for example, the magnetic layer having the perpendicular magnetic anisotropy is used for the magnetic layers 11 and 12 of the MTJ element 10.

The magnetic body 50 may have in-plane magnetic anisotropy. Here, the easy magnetization axis direction of the magnetic bodies 50 is parallel in relation to the Z direction. When the magnetic body 50 has the in-plane magnetic anisotropy, for example, the magnetic layer having the in-plane magnetic anisotropy is used for the magnetic layers 11 and 12 of the MTJ element 10.

FIG. 5 is a schematic view illustrating a modification example of the magnetic body used in the memory cell unit of the domain wall memory of the embodiment.

As illustrated in FIG. 5, the magnetic body (the domain wall moving layer) 50 of the constriction structure in the memory cell unit MU of the domain wall memory 1 may extend in the parallel direction (for example, the X direction) in relation to the front surface of the substrate 9. The magnetic body 50 of the constriction structure of FIG. 5 is a flat plate-shaped magnetic layer.

Relating to the dimension of each portion of the plate-shaped magnetic body 50 having the constriction structure, the minimum dimension (the dimension of the recess portion 519) D1 of the constriction area AR1 in the Y direction is smaller than the maximum dimension (for example, the maximum dimension of the protrusion 510) D3 of the cell area AR2 in the Y direction.

When the memory cell MC stores data, the magnetic domain is formed in the protrusion 510 by the magnetization in the protrusion 510 (the cell area AR2). According to the formation of the magnetic domain, the domain wall DW is formed in the magnetic body 50.

When the plurality of memory cells MC of the magnetic bodies 50 store data, one or more magnetic domains are arranged along the Z direction.

In the domain wall memory 1 of the first embodiment, in order to shift the data in the memory cell unit, the shift operation of the domain wall is performed.

(b) Basic Example

With reference to FIGS. 6A to 12, a basic example of the operation of the domain wall memory is described.

(b-1) Shift Operation

Figure 6A:
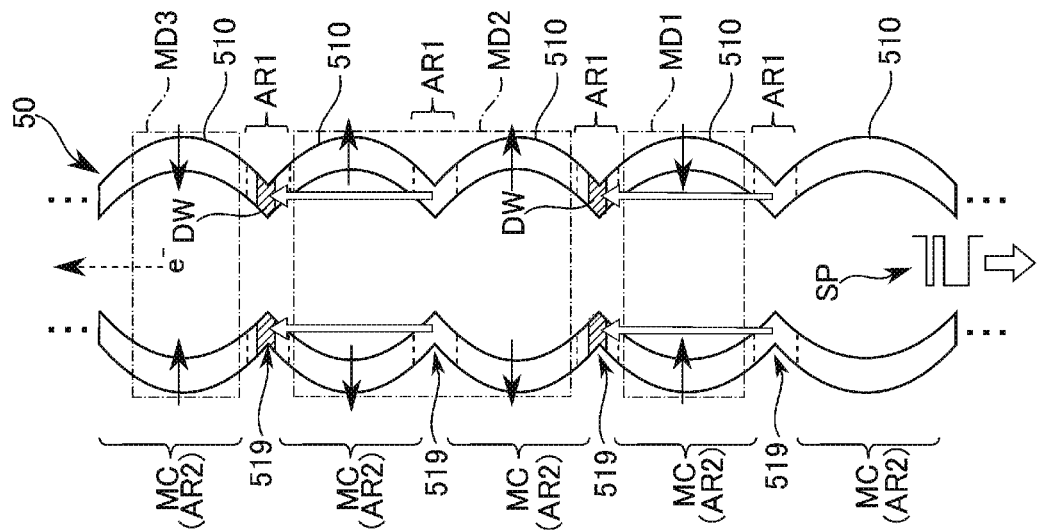
FIGS. 6A and 6B are diagrams illustrating aspects related to pulses of a shift operation in a magnetic memory according to a first embodiment.
Figure 6B:
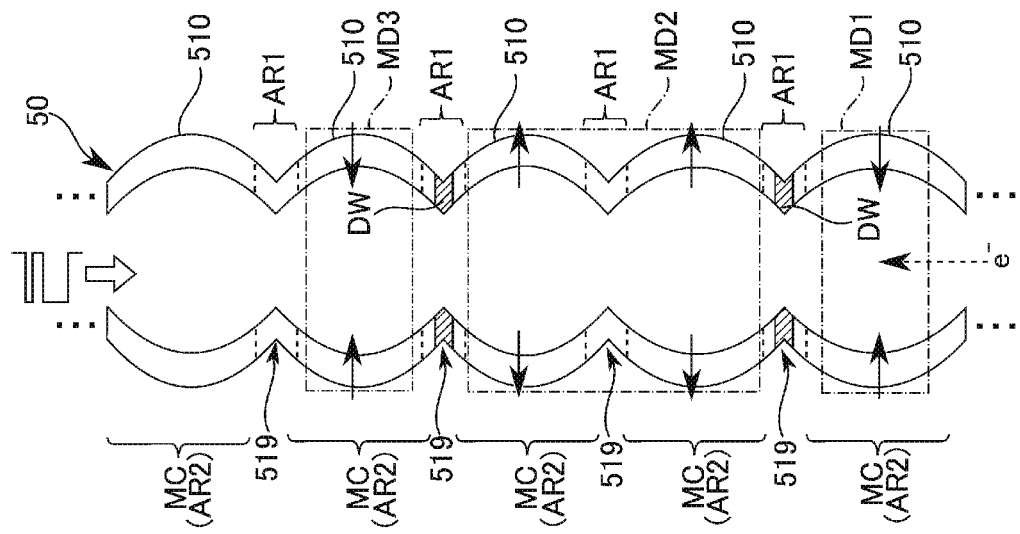

FIGS. 6A and 6B are schematic views illustrated for description of the shift operation of the domain wall memory.

As illustrated in FIG. 6A, before the supply of a shift pulse SP used in the shift operation, each of the plurality of memory cells has magnetization (a magnetic domain) corresponding to the stored data. For example, first piece of data (one of "0" and "1") associates with the magnetization toward the outside of the tubular magnetic body 50, and second piece of data (the other one of "0" and "1") associates with magnetization toward the inside of the tubular magnetic body 50.

When the directions of the magnetization of two of the adjacent memory cells MC are different from each other, the domain wall DW is disposed in the constriction areas AR1. Two of the cell areas AR2 corresponding to the adjacent memory cells MC each have the magnetic domains MD (MD1, MD2, and MD3) separated by the domain walls DW.

When the directions of the magnetization of the adjacent memory cells MC are the same, the domain walls DW are not formed in the constriction area AR1 between two of the cell areas AR2 corresponding to the adjacent memory cells MC. The adjacent cell areas having magnetization with the same direction have the magnetic domains MD continuous between two of the areas AR2. According to the arrangement of "1" and "0" of the data stored in the memory cell unit, one of the magnetic domains MD may be formed to extend over three or more cell areas AR2.

As illustrated in FIG. 6B, during the shift operation, the shift pulse SP is supplied to the magnetic bodies 50. The shift pulse SP flows in the magnetic body 50 from one end of the magnetic body 50 to the other end of the magnetic body 50.

When the shift pulse SP is supplied to the magnetic body 50, all of the domain walls DW in the magnetic body 50 move substantially at the same time in the magnetic body 50 by the shift pulse SP along the traveling direction (in an opposite direction in relation to the traveling direction of the shift pulse SP) of electrons. For example, the domain wall in the shift operation moves by the domain wall driving force resulting from spin transfer torque (STT) and spin orbit torque (SOT) generated in the magnetic body.

Along the traveling direction of electrons and the opposite direction, the domain walls DW may move. The moving direction of the domain wall can be controlled by the material of the magnetic body, the material of the conductive members stacked on the magnetic body, the position of the conductive member with respect to the magnetic body, the manufacturing condition, and the like. When conductive members are stacked on the magnetic body, as the material of the conductive member, platinum (Pt), tungsten (W), tantalum (Ta), or the like may be used. However, the material of the conductive member is not limited thereto.

In the following, as an example, a case where the domain wall DW moves in the magnetic body along the traveling direction of electrons by the shift pulse SP is described.

According to the movement of the domain walls DW, the magnetization (magnetic domain) MD moves.

Accordingly, the data shifts in the magnetic body 50 in the memory cell unit.

The shift operation (movement of the domain wall and the magnetic domain) is performed by the supply of the pulse (for example, the current pulse) with respect to the magnetic body 50 so that the domain wall DW is positioned in the recess portion 519 of the magnetic body 50 of the constriction structure.

In the magnetic body 50 of the constriction structure, the domain wall DW can be stably present in the magnetic area (here, the constriction area AR1) having a smaller volume than the magnetic area (here, the cell area AR2) having a large volume.

Therefore, the domain wall DW moving by the shift operation tends to be positioned in the recess portion 519 and in the area near the recess portions 519.

As a result, when the magnetic body 50 of the constriction structure is used, controllability of the position of the domain wall DW in the magnetic body 50 can be improved.

In the domain wall memory of the present embodiment, the shift pulse SP includes a plurality of pulses.

(b-2) Shift Pulse

Figure 7:
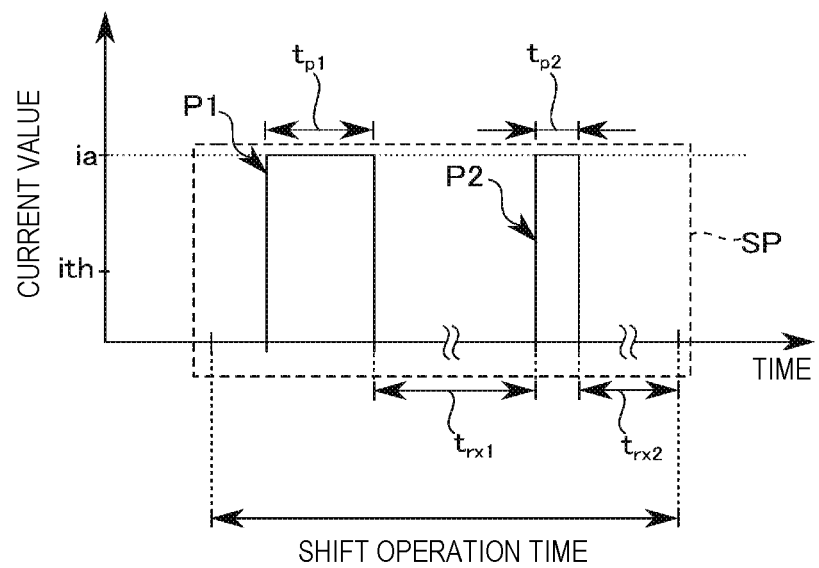
FIG. 7 is a diagram illustrating aspects related to pulses of a shift operation in a magnetic memory according to a first embodiment.

FIG. 7 is a waveform diagram illustrating a shift pulse used in the shift operation of the domain wall memory of the first embodiment. The horizontal axis of FIG. 7 corresponds to time (a pulse width), and the vertical axis of FIG. 7 corresponds to a current value.

As illustrated in FIG. 7, the shift pulse SP is supplied during a period TS (also referred to as a shift operation period TS) of the shift operation.

The shift pulse SP is, for example, a current pulse and may be referred to as a shift current SP.

The shift current SP includes a first pulse P1 and a second pulse P2. The first pulse P1 (also referred to as a main pulse P1) has a pulse width $t_{p1}$. The first pulse P1 has a current value ia. The second pulse P2 (also referred to as an adjustment pulse P2) has a pulse width $t_{p2}$. The second pulse P2 has the current value ia.

The current value ia is equal to or larger than a threshold $i_{th}$ (also referred to as a domain wall shift threshold $i_{th}$) for the movement of the domain wall. When a current having a current value equal to or larger than the domain wall shift threshold $i_{th}$ is supplied to the magnetic body 50, the domain wall (the magnetic domain) in the magnetic body 50 moves. When the current value of the current supplied to the magnetic body 50 is smaller than the domain wall shift threshold $i_{th}$, the domain wall in the magnetic body 50 does not move.

The pulse width $t_{p2}$ is narrower than the pulse width $t_{p1}$. For example, the pulse width $t_{p2}$ has a pulse width equal to or less than 50% of the pulse width $t_{p1}$.

For example, the pulse widths $t_{p1}$ and $t_{p2}$ are values based on the full widths at half maximum (FWHM) of the pulses P1 and P2, respectively. The pulse widths $t_{p1}$ and $t_{p2}$ may be values defined by other than the full width at half maximum.

The pulse width $t_{p1}$ is set according to the time for moving to a constriction area corresponding to the recess portion 519 <k+1> adjacent to the constriction area AR1 corresponding to the recess portion 519 <k> having the domain wall DW in the direction (Z direction) flowing the shift current.

For example, the pulse width $t_{p1}$ (which corresponds to the moving time of the domain wall DW) is set according to a dimension DA (corresponding to the interval between the recess portions 519) of the cell area AR2 in the Z direction. By using the moving time (of the domain wall DW and the interval between two of the recess portions 519 (corresponding to dimension DA, which also corresponds to the dimension of the protrusion 510 along the moving direction of the domain wall DW), the moving speed of the domain wall can be obtained.

For example, when the moving speed of the domain wall at the current of current value ia is defined as $v_{DW}$, the relationship of the moving speed, the pulse width, and the dimension DA (dimension of the cell portions 510) between the recess portions 519 in the main pulse P1 of the current value ia preferably satisfies the relationship: $v_{DW} \times t_{p1} \geq DA$. The relationship of the moving speed, the pulse width, and a dimension DB of the recess portion 519 in the adjustment pulse P2 of the current value ia preferably satisfies the relationship: $v_{DW} \times t_{p2} \leq DB/2$.

A period $t_{rx1}$ (also referred to as relaxation time $t_{rx1}$) is provided between the first pulse P1 and the second pulse P2. The relaxation time $t_{rx1}$ depends on the time until the magnetization reaches in the equilibrium state. In the relaxation time $t_{rx1}$, as the magnetization reaches in the equilibrium state, the shifted domain wall DW is stabilized.

A certain period $t_{rx2}$ (relaxation time $t_{rx2}$) is provided between the supply of the second pulse P2 and the supply of the shift current SP.

As such, in the present embodiment, the two pulses P1 and P2 of the shift current SP have the same current value ia but different pulse widths $t_{p1}$ and $t_{p2}$.

The domain wall memory of the present embodiment can move the magnetic domain and the domain wall in the magnetic body 50 by the shift current SP including the two pulses P1 and P2.

Figure 8:
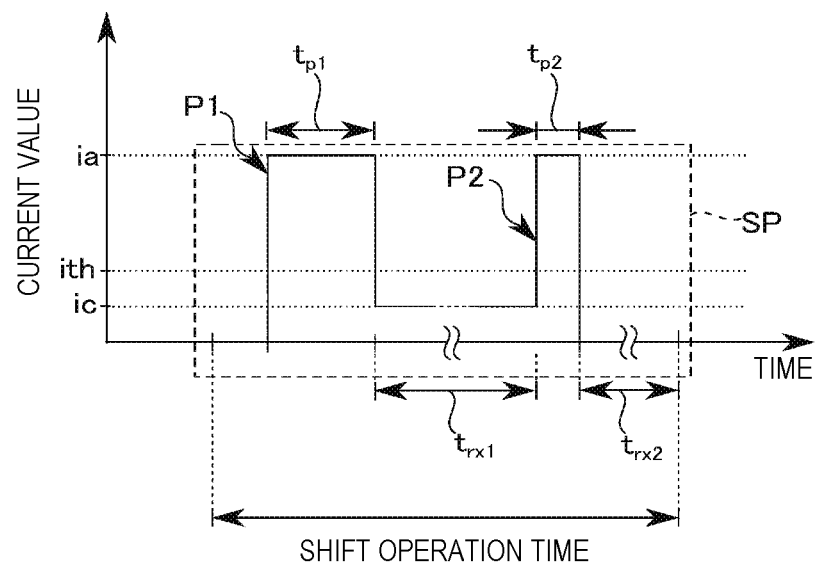
FIG. 8 is a diagram illustrating aspects related to an operation example of a magnetic memory according to a first embodiment.

FIG. 8 is a waveform diagram illustrating a shift current of the modification example of the domain wall memory of the present embodiment.

As illustrated in FIG. 8, so long as the current value of the shift current SP is less than the domain wall shift threshold $i_{th}$, the shift current SP may have a current value ic, which is greater than 0, in the period (relaxation time) between the two pulses P1 and P2.

The domain wall shift threshold $i_{th}$ corresponds to a current value that causes the domain wall to move (change). When the current value of the current flowing in the magnetic body 50 is less than the domain wall shift threshold $i_{th}$, then even if current is supplied to the magnetic body 50, the domain wall does not move.

The current value ic is larger than 0 but less than the domain wall shift threshold $i_{th}$.

Here, the two pulses P1 and P2 of the shift current SP have pulse shapes for which the current value is continuously greater than 0.

(b-3) Mechanism

Figure 9:
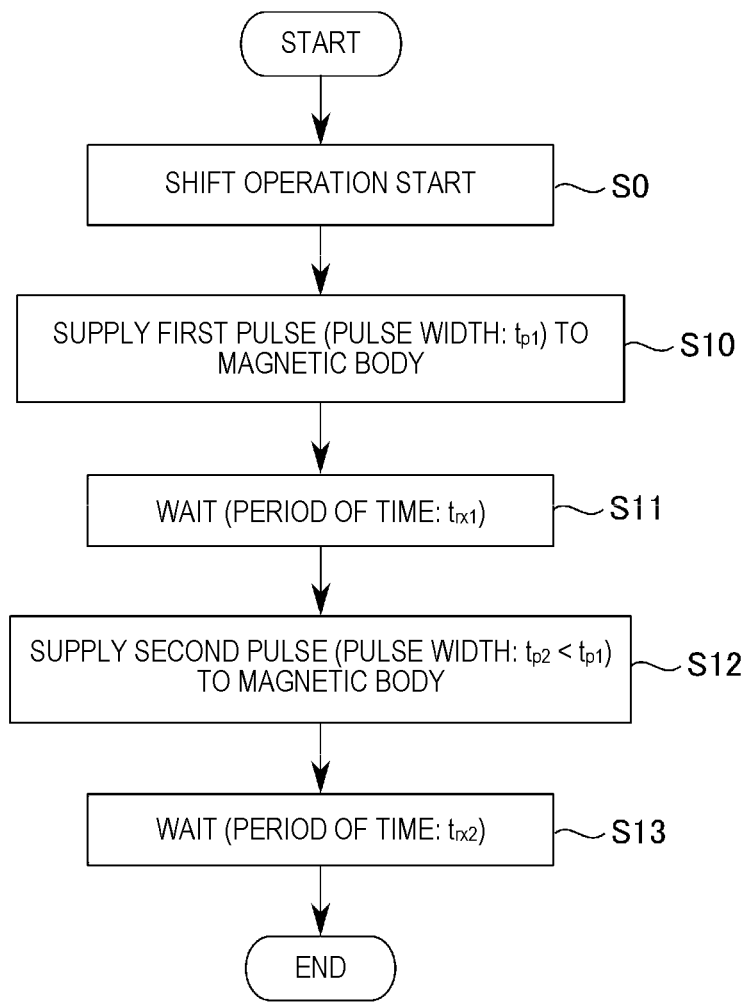
FIG. 9 is a flowchart illustrating aspects related to an operation example of a magnetic memory according to a first embodiment.
Figure 10A:
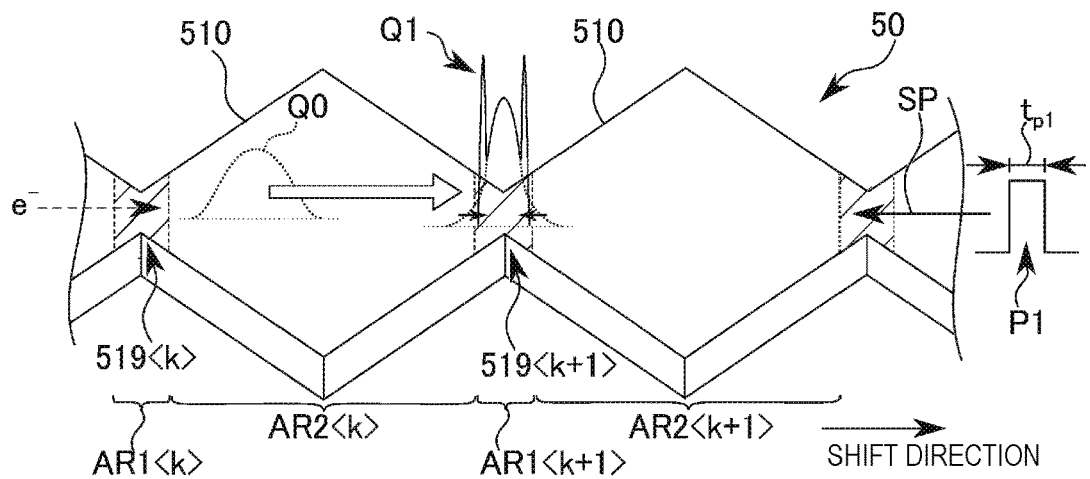
FIGS. 10A to 10C are diagrams illustrating aspects related to operation examples of a magnetic memory according to a first embodiment.
Figure 10B:
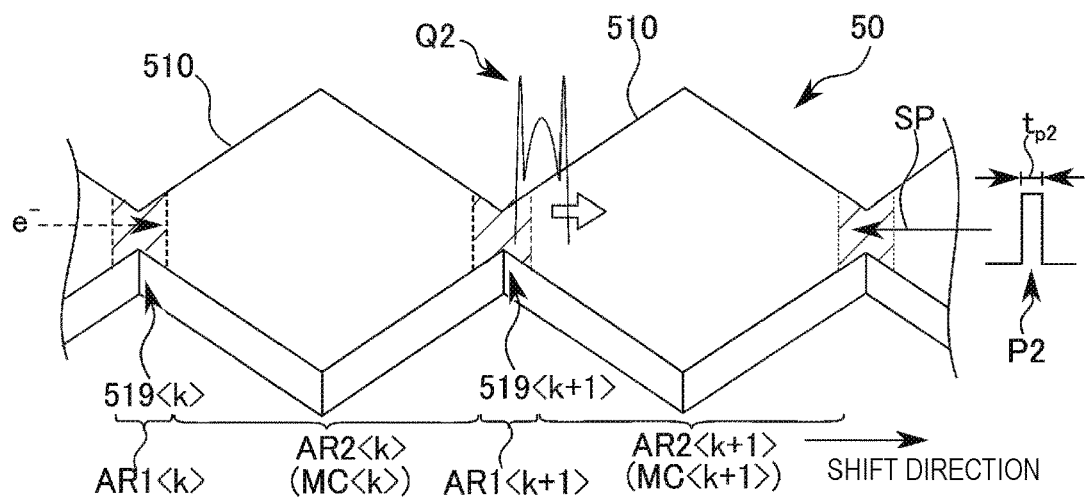
Figure 10C:
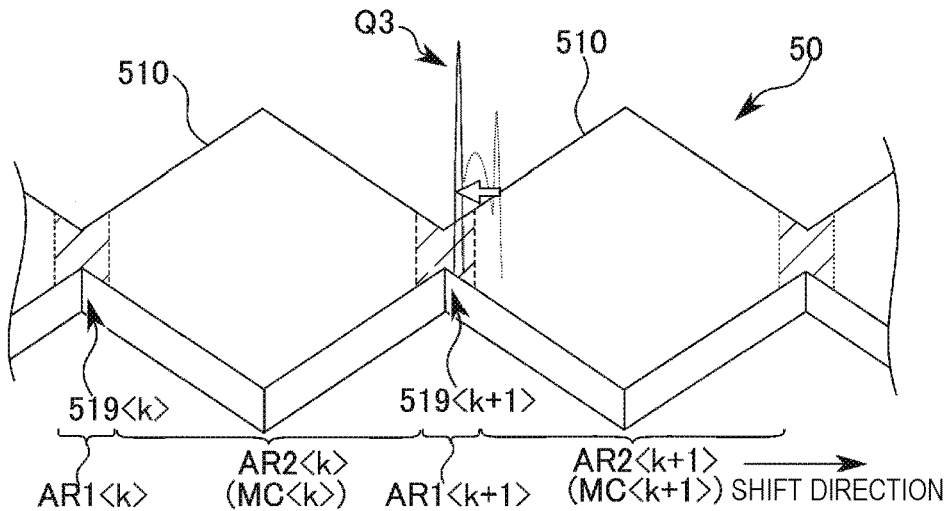

With reference to FIGS. 9 to 10C, a mechanism of the shift operation in the domain wall memory of the first embodiment is described.

FIG. 9 is a flowchart illustrating a supply of the shift pulse in the shift operation of the domain wall memory of the first embodiment.

FIGS. 10A to 10C are schematic views illustrating a state of the movement of the domain wall during the shift operation in the domain wall memory of the present embodiment. In FIGS. 10A to 10C, the reference symbols Q1, Q2, and Q3 refer to probability distributions regarding of the presence (location) of a certain domain wall (DW) in the magnetic body. FIGS. 10A to 10C illustrate the magnetic body 50 as having a plate-shaped constriction structure for clarification and simplification of description.

<Step S0>

During the shift operation of the domain wall memory of the present embodiment, the supply of the shift current SP including the plurality of pulses P1 and P2 starts.

<Steps S10 and S11>

As illustrated in FIG. 10A, the first pulse (main pulse) P1 having a certain current value (Ia>$I_{th}$) is supplied to the magnetic body 50 of the constriction structure. The main pulse P1 has the pulse width $t_{p1}$.

The domain wall DW in the constriction area AR1 <k> including a certain recess portion 519 moves in the protrusion 510 (the cell area AR2) of the magnetic body 50 by the supplied main pulse P1. The shift direction of the domain wall DW is along the opposite direction (the moving direction of an electron e⁻) in relation to the direction in which the main pulse P1 flows in the magnetic body 50.

Resulting from the variation of the amount of movement of the domain wall DW with respect to the supplied pulse, the variation of the magnetic characteristics in the magnetic body, and the like, the probability distribution (Q1) for the position of the domain wall DW within a certain area has a certain spread.

By the main pulse P1, the domain wall DW moves in the constriction area AR1 <k+1> adjacent to the constriction area AR1 <k> with the cell area AR2 <k> interposed therebetween.

The supply of the main pulse P1 stops. Accordingly, the shift operation temporarily enters a standby state in the period $t_{rx1}$ from the stop of the supply of the main pulse P1 to the start of the supply of the adjustment pulse P2. In the magnetic body 50, the magnetic states of the protrusions 510 and the recess portions 519 move toward the equilibrium state by the stop of the supply of the pulse P1.

At the relaxation time $t_{rx1}$, a moving domain wall DW1 converges on a portion (a portion having a smaller dimension) having a volume smaller than that in the magnetic body 50 to reach a more stable energy state.

Therefore, the probability of the domain wall DW being present in the constriction area AR1 <k+1> becomes high in an area near a boundary between the constriction area AR1 <k+1> and the cell area AR2 <k> and an area near a boundary between the constriction area AR1 <k+1> and the cell area AR2 <k+1>.

<Step S12>

As illustrated in FIG. 10B, after the elapse of the relaxation time $t_{rx1}$, the second pulse P2 is supplied to the magnetic body 50.

According to the pulse width $t_{p2}$ of the adjustment pulse P2, the domain wall DW moves from the constriction area AR1 <k+1> to the cell area AR2 <k+1> side along the opposite direction (the moving direction of the electron e⁻) in relation to the traveling direction of the adjustment pulse P2. The pulse width $t_{p2}$ is smaller than the pulse width $t_{p1}$. Therefore, the shift amount of the domain wall DW by the pulse P2 is smaller than the shift amount of the domain wall DW by the pulse P1.

For example, when the domain wall DW is positioned near the boundary between the constriction area AR1 <k+1> and the cell area AR2 <k+1>, the domain wall DW is shifted into the cell area AR2 <k+1>.

For example, when the domain wall DW is positioned near the center portion of the constriction area AR1, the domain wall DW is shifted to a portion near the boundary between the constriction area AR1 <k+1> and the cell area AR2 <k+1>.

<Step S13>

The supply of the adjustment pulse P2 stops. Therefore, the shift operation enters a standby state.

The magnetic domain and the domain wall DW reach an equilibrium state.

At the relaxation time $t_{rx2}$, when the domain wall is present outside the constriction area AR1 <k+1> (that is, in the cell area AR2 <k+1>), as illustrated in FIG. 10C, the domain wall DW is shifted to a portion (a portion on the recess portion 519 side) having a volume smaller than that of the currently positioned portion for the stabilization of the energy.

As a result, the probability distribution Q3 of the presence probability of the domain wall DW has the highest peak at the end portion of the constriction area AR1 <k+1> on the boundary between the area AR1 <k+1> and the area AR2 <k+1>. The distribution Q3 for the domain wall DW after the supply of the adjustment pulse P2 has the comparatively smaller distribution width that of the distribution Q2.

As such, the domain wall memory 1 of the present embodiment performs the shift operation by using the shift current SP including the plurality of pulses P1 and P2.

Accordingly, the domain wall memory 1 of the present embodiment can increase the probability of the domain wall being in a certain area AR1 with the recess portion 519 as the center. Therefore, the domain wall memory of the present embodiment can reduce the variation of the position of the domain wall in a certain area AR1.

As a result, the domain wall memory of the present embodiment can prevent the occurrence of the shift error of the domain wall.

(b-4) Setting of Shift Pulse

<Pulse Width>

Figure 11A:
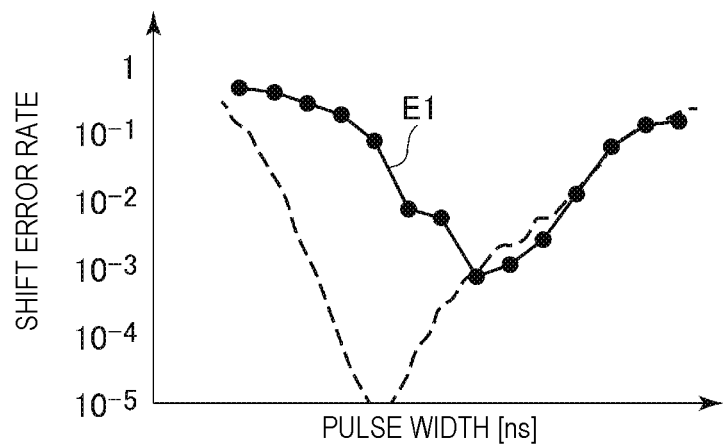
FIGS. 11A to 11C illustrate aspects of operation examples of a magnetic memory according to a first embodiment.
Figure 11B:
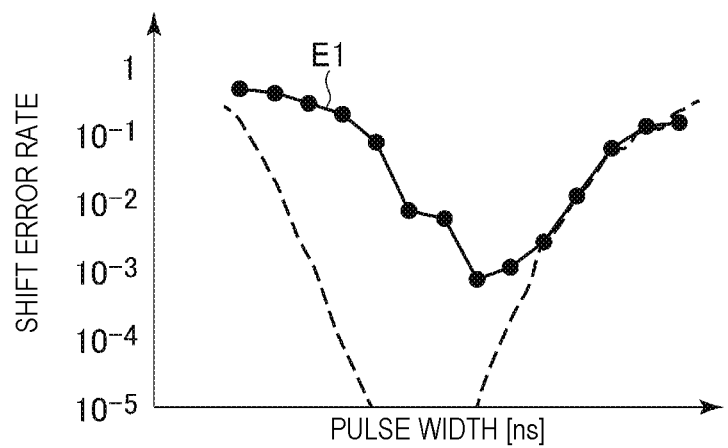
Figure 11C:
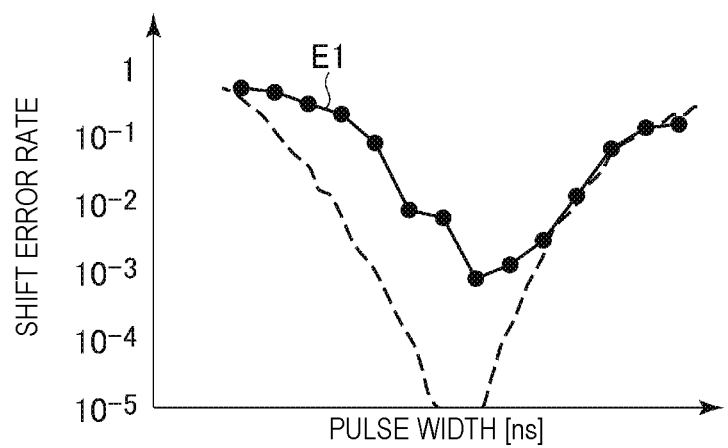

With reference to FIGS. 11A to 11C, in the shift operation of the domain wall memory of the first embodiment, the setting of the pulse width of the shift pulse is described.

FIGS. 11A to 11C are graphs illustrating relationships between the pulse widths and the shift errors, respectively.

In FIGS. 11A to 11C, the vertical axis of each graph corresponds to a shift error rate, and the horizontal axis of each graph corresponds to the pulse width of the shift pulse.

In FIGS. 11A to 11C, the magnetic body of the constriction structure is used for verification. The interval between the recess portions is set to 200 nm. The difference between the dimension (the maximum dimension of the protrusion 510) of a portion of a peak in the constriction and the dimension (the minimum dimension of the recess portion 519) of a portion of a valley of the constriction is set to 25 nm.

Here, the pulse width of the shift current when the shift operation (the movement of the domain wall between the recess portions) is performed by using the shift current including one pulse is denoted by "$t_{p0}$". As an example of the pulse width $t_{p0}$, the pulse width $t_{p0}$ is set to about 1 ns to 5 ns.

For example, the pulse widths $t_{p1}$ and $t_{p2}$ of two pulses included in the shift current SP according to the first embodiment have the relationship: $t_{p0}=t_{p1}+t_{p2}$.

In FIGS. 11A to 11C, the values of the pulse widths of the horizontal axes of the graphs indicate the pulse width $t_{p1}$ of the pulse P1 of the shift current according to the present embodiment and the pulse width $t_{p0}$ of the shift current including one pulse.

In each of FIGS. 11A to 11C, the pulse width $t_{p2}$ of the pulse P2 of the shift current according to the embodiment is set to the predetermined value (for example, the value set based on a proportion to the pulse width $t_{p0}$ or the pulse width $t_{p1}$).

In FIG. 11A, the pulse width $t_{p2}$ of the adjustment pulse P2 is set to about 30% of the pulse width $t_{p0}$ in which a shift error rate (a line E1) described below becomes the minimum.

In FIG. 11B, the pulse width $t_{p2}$ of the adjustment pulse P2 is set to about 15% of the pulse width $t_{p0}$ in which the shift error rate (the line E1) described below becomes the minimum.

In FIG. 11C, the pulse width $t_{p2}$ of the adjustment pulse P2 is set to about 8% of the pulse width $t_{p0}$ in which the shift error rate (the line E1) becomes the minimum.

In FIGS. 11A to 11C, the line E1 indicates the experimental result of the shift operation using the shift current including one pulse (the pulse width $t_{p0}$). In FIGS. 11A to 11C, the broken line indicates the experimental result (simulation result) of the shift operation using the shift current including the two pulses P1 and P2 according to the present embodiment.

As illustrated in FIGS. 11A to 11C, when the shift current including the two pulses P1 and P2 as in the present embodiment is used in the shift operation of the domain wall memory, the shift error rate according to the present embodiment becomes smaller than the shift error rate (the line E1) of the shift operation of the domain wall memory using the shift current including one pulse.

Based on the results on FIGS. 11A to 11C, the pulse width $t_{p2}$ of the adjustment pulse P2 is desirably set, for example, to be equal to or larger than 10% of the pulse width $t_{p1}$ and equal to or lower than 50% of the pulse width $t_{p1}$ of the main pulse P1.

For example, the pulse width $t_{p2}$ of the adjustment pulse P2 may be set to be equal to or larger than 10% of the value $t_{p0}$ and less than 50% of the pulse width $t_{p0}$ in relation to the total value (pulse width) $t_{p0}$ of the pulse width $t_{p1}$ of the pulse P1 and the pulse width $t_{p2}$ of the pulse P2.

The pulse width $t_{p2}$ of the adjustment pulse P2 is preferably set to be equal to or less than 40% of the pulse width $t_{p1}$ of the main pulse P1 and more preferably set to be equal to or less than 30%.

<Relaxation Time>

Figure 12:
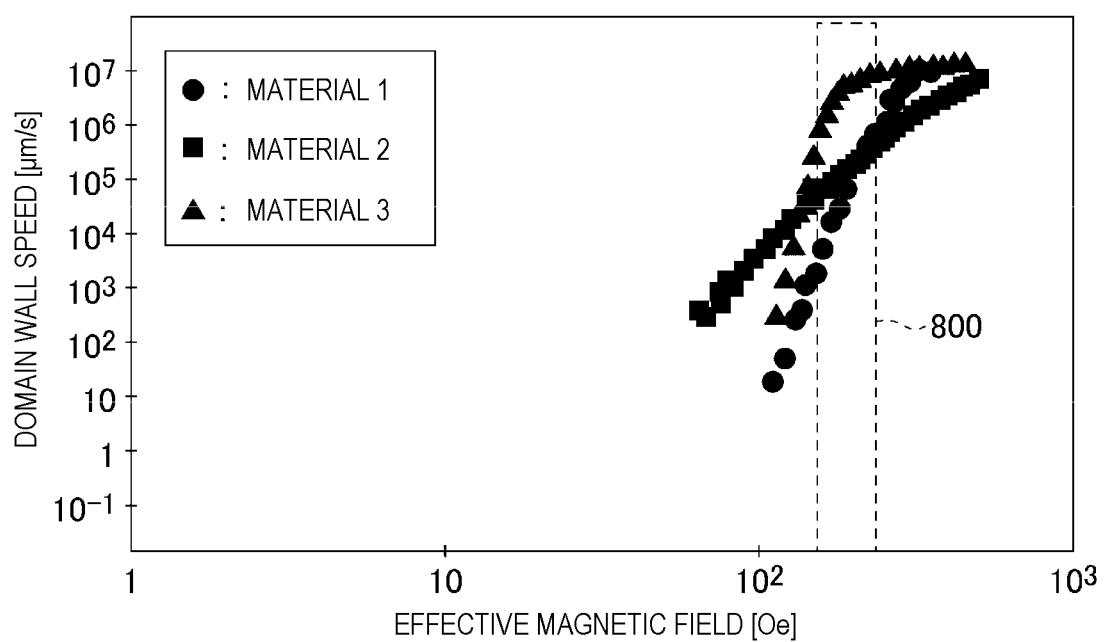
FIG. 12 is a graph related to aspects of an operation example of a magnetic memory according to a first embodiment.

With reference to FIG. 12, in the shift operation of the domain wall memory of the present embodiment, the setting of the relaxation time of the shift pulse is described.

FIG. 12 is a graph illustrating a relationship between the magnetic field and the moving speed of the domain wall.

In FIG. 12, the horizontal axis of the graph corresponds to the size of an effective magnetic field of the magnetic body, and the vertical axis of the graph corresponds to the moving speed of the domain wall. In the graph of FIG. 12, relating to three kinds of magnetic materials (materials 1, 2, and 3), the relationship between the effective magnetic field of the magnetic body and the moving speed of the domain wall is illustrated.

In the present embodiment, the size of the effective magnetic field of the recess portion (the magnetic body in the constriction area) is assumed to be in a range (an area 800 surrounded by a dotted line in FIG. 12), for example, from 200 Oe to 300 Oe.

As illustrated in FIG. 12, based on the estimated range 800 of the effective magnetic field of the recess portion, as the moving speed of the domain wall according to the effective magnetic field, the size of about 0.1 m/s to 1 m/s can be obtained.

For example, the value of the ideal relaxation time $t_{rx1}$ and $t_{rx2}$ is 50 ns or longer. In the relaxation time, the moving distance of the domain wall according to the effective magnetic field of recess portion (constriction area) of the magnetic body becomes 50 nm or longer.

For example, when the relaxation time $t_{rx1}$ and $t_{rx2}$ is set to 1 ms, the domain wall can move about 100 μm to 1,000 μm according to the effective magnetic field (for example, the effective magnetic field of the recess portion) of the magnetic body. Here, the position of the domain wall can be put into the constriction area AR1.

In the present embodiment, the relaxation time $t_{rx1}$ and relaxation $t_{rx2}$ during the shift operation are preferably 50 ns to 1 ms.

The size of the effective magnetic field of the recess portion in the magnetic body changes according to the material of the magnetic body, the size of the constriction formed in the magnetic body 50, and the dimension (the dimension of the protrusion) between the recess portions. Even when the effective magnetic field of the recess portion changes according to the structure (shape) and the material of the magnetic body, the preferable relaxation time can be set considering the moving distance and the moving speed.

(c) Operation Example

Figure 13:
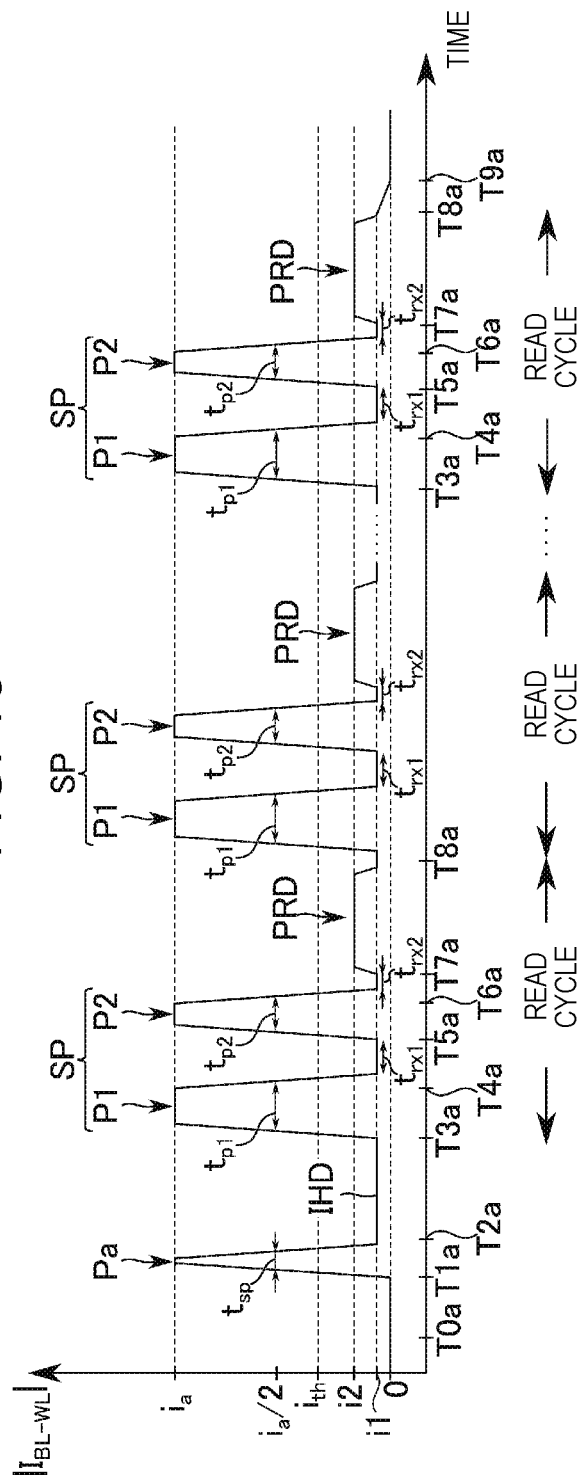
FIG. 13 is a diagram illustrating aspects of an operation example of a magnetic memory according to a first embodiment.
Figure 14:
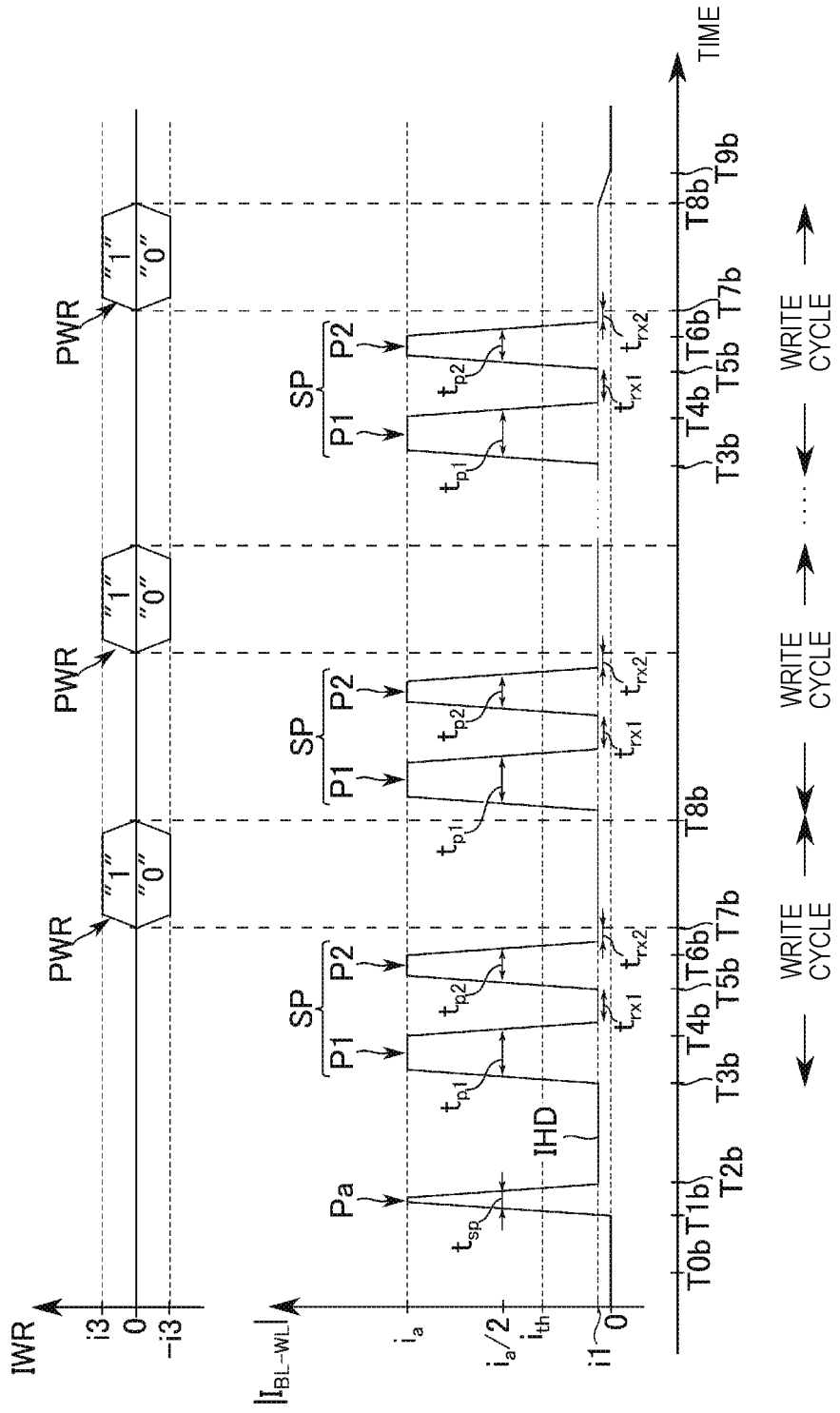
FIG. 14 is a diagram illustrating aspects of an operation example of a magnetic memory according to a first embodiment.

With reference to FIGS. 13 and 14, the operation example of the shift operation of the domain wall memory according to the present embodiment is described. The shift pulse of the domain wall memory according to the present embodiment is applicable to the operation sequence including the read operation and the operation sequence including the write operation.

[Read Sequence]

FIG. 13 illustrates an example of the operation sequence including the shift operation and the read operation in the domain wall memory of the present embodiment.

In FIG. 13, the horizontal axis of the graph corresponds to the time, and the vertical axis of the graph corresponds to the current value of a current ($I_{BL-WL}$) flowing between the bit line and the word line. In the graph of FIG. 13, the current value is indicated as an absolute value. Here, the polarity of the current $I_{BL-WL}$ when the current $I_{BL-WL}$ flows from the bit line to the word line is different from the polarity of the current $I_{BL-WL}$ when the current $I_{BL-WL}$ flows from the word line to the bit line.

<Time T0a>

The external device (for example, the host device or the controller) 2 sends a command and an address (in the following, referred to as a selected address) of an operation target to the domain wall memory 1 of the embodiment. At the time of the command of the read operation, the external device sends the read command to the domain wall memory 1.

The domain wall memory 1 receives the read command and the selected address.

At time T0a, the domain wall memory 1 starts the read operation of the data in the memory cell unit (in the following, referred to as a selected memory cell unit) corresponding to the selected address based on the read command. For example, by the read command, the data of the plurality of memory cells MC in the selected memory cell unit is continuously read.

<Time T1a and T2a>

As illustrated in FIG. 13, at time T1a, a switching current Pa (also referred to as a switching pulse or a spike current) is supplied to the selected memory cell unit as a current $|I_{BL-WL}|$ flowing between the selected bit line and the selected word line according to the selected address. In the memory cell unit to which the switching current Pa is supplied, the switching element 20 is turned on. Therefore, the selected memory cell unit MU is set to the activation state (selected state).

The switching current Pa has the current value ia. Here, the current value of the switching current Pa may be a value different from the current value ia. When the current value of the switching current Pa is set to the same value as the current value of the shift pulse SP, the circuit configuration of the domain wall memory can be simplified.

The pulse width of the switching current Pa becomes smaller than the pulse width of the adjustment pulse P2 of the shift current SP. Therefore, even if the switching current Pa flows in the magnetic body 50, the movement of the domain wall resulting from the switching current Pa does not substantially occur.

After the supply of the switching current Pa (for example, time T2a), as the current $|I_{BL-WL}|$, a hold current IHD is supplied to the selected memory cell unit. The hold current IHD has a current value i1 in which the switching element 20 can maintain the on state. The current value i1 is lower than the current value ia of the switching current Pa and the domain wall shift threshold $i_{th}$.

Accordingly, the selected memory cell unit is set to a conductive state in relation to the selected bit line BL.

<Time T3a and T4a>

After the selected memory cell unit is set to the activation state, the supply (shift operation) of the shift current SP for the first cycle starts. The shifting circuit 160 supplies the shift current SP to the selected memory cell unit MU.

At time T3a, the first pulse (main pulse) P1 of the shift current SP is supplied from the bit line BL side to the magnetic body 50 by the shifting circuit 160. The pulse P1 has the current value ia. The main pulse P1 has the pulse width $t_{p1}$. The pulse width $t_{p1}$ is the size of the full width at half maximum of the pulse P1.

In the period corresponding to the pulse width $t_{p1}$, the current pulse P1 having the current value ia flows in the magnetic body 50 from the selected bit line BL to the selected word line WL. The electrons move from the selected word line WL along the selected bit line BL. Accordingly, all the domain walls in the magnetic body 50 move along the moving direction of the electrons. The domain wall DW is shifted from a certain constriction area AR1 <k> into the next adjacent constriction area AR1 <k+1> in the magnetic body 50. For example, each domain wall in the magnetic body 50 is substantially simultaneously shifted from the word line WL side to the bit line BL side.

For example, by the shift operation of the read sequence, the magnetic domain (magnetization) is shifted from the memory cell on the lower end side (the word line side) of the selected memory cell unit MU to the memory cell MC on the upper end side (the bit line side) of the selected memory cell unit by one bit.

By the supply of the main pulse P1, the domain wall DW has the distribution Q of the presence probability illustrated in FIG. 10A and is disposed in the constriction area AR1 <k+1> of the movement destination.

After the elapse of the period corresponding to the pulse width $t_{p1}$ from the start of the supply of the pulse P1 (for example, time T4a), the shifting circuit 160 decreases the current value of the supplied current $|I_{BL-WL}|$ from the current value is to the current value i1.

Accordingly, the supply of the main pulse P1 stops. By the supply of the current IHD of the current value i1, the switching element 20 maintains the on state.

<Time T5a and T6a>

After the elapse of the relaxation time $t_{rx1}$ from the stop of the supply of the main pulse P1, at time T5a, the second pulse (adjustment pulse) P2 of the shift current SP is supplied from the selected bit line BL side to the magnetic body 50 by the shifting circuit 160. The adjustment pulse P2 has the current value ia. The pulse P2 has the pulse width $t_{p2}$. The pulse width $t_{p2}$ corresponds to the size of the full width at half maximum of the pulse P2.

By the supply of the adjustment pulse P2, the domain wall DW is shifted to a portion near a boundary between the constriction area AR1 and the cell area AR2 along the moving direction of the electrons.

Accordingly, the domain wall DW can be present in the constriction area AR1 or in an area near a boundary between the constriction area AR1 and the cell area AR2 to have the distribution Q of the presence probability as illustrated in FIG. 10B.

After the elapse of the period corresponding to the pulse width $t_{p2}$ from the start of the supply of the pulse P2 (for example, time T6a), the shifting circuit 160 decreases the current value of the supplied current $|I_{BL-WL}|$ from the current value ia to the current value i1.

Accordingly, the supply of the pulse P2 stops. The switching element 20 maintains the on state by the hold current IHD.

According to the present embodiment, the hold current IHD flows in the magnetic body 50 during the relaxation periods $t_{rx1}$ and $t_{rx2}$.

By the supply of the hold current IHD, a leakage magnetic field resulting from the hold current IHD or a small domain wall moving force resulting from the hold current IHD is generated in the magnetic body 50. The leakage magnetic field resulting from the hold current IHD is applied to the effective magnetic field resulting from the constriction area (recess portion). Accordingly, the relaxation periods $t_{rx1}$ and $t_{rx2}$ are shortened. As a result, the speed of the memory operation in the domain wall memory can be increased.

The magnetic domain (magnetization) moving in the reading cell MCA in the shift operation works on the magnetization of the storage layer 11 of the MTJ element 10 via the magnetic layer 59. The direction of the magnetization of the storage layer 11 is set to the same direction as the direction of the magnetization in the reading cell MCA.

As such, the shift operation of the first cycle in the read sequence is completed.

For example, a certain period $t_{rx2}$ (referred to as relaxation time $t_{rx2}$) elapses from the stop of the supply of the pulse P2.

In the relaxation time $t_{rx2}$, the presence probability of the position of the domain wall DW converges on the end portion of the constriction area AR1 as illustrated in the distribution Q of FIG. 10C.

As such, according to the first embodiment, the variation of the position of the domain wall after the supply of the shift current is reduced.

<Time T7a and T8a>

In the first read cycle, after the shift operation, the reading circuit 150 performs the read operation.

At time T7a after the elapse of the relaxation time $t_{rx2}$, the reading circuit 150 supplies a read current (reading pulse) PRD to the selected memory cell unit MU.

A current value i2 of the read current IRD is smaller than a magnetization reversal threshold of the storage layer 11 and the domain wall shift threshold $i_{th}$ of the magnetic body 50. The current value i2 is larger than the current value i1. For example, the read current IRD flows in the direction from the word line WL to the bit line BL.

According to the magnetization arrangement of the reference layer 12 and the storage layer 11 in the MTJ element 10, the current value of the current flowing the selected bit line BL and the potential of the bit line BL vary.

The reading circuit 150 senses the current value or the potential on the bit line BL.

Based on the sensing result, the reading circuit 150 can determine the data in the reading cell MCA.

Accordingly, in the first read cycle, data are read.

At time T8a, the reading circuit 150 decreases a current value of the supplied current $|I_{BL-WL}|$ from the current value i2 to the current value i1.

As such, the first read cycle is completed.

Subsequent to the first read cycle, the second read cycle is performed.

Same as the first read cycle, the shift operation in the second read cycle is performed. By the shift operation, the data is shifted in the reading cell MCA.

When the domain wall DW moves by the shift operation using the shift current SP according to the present embodiment, the variation of the position of the domain wall DW in the constriction area AR1 is small. Therefore, in the shift operation of the second read cycle, the variation of the position of the shifted domain wall DW decreases.

As a result, in the domain wall memory of the present embodiment, the shift error in the read sequence is reduced.

After the shift operation, in the second read cycle, the read operation is performed in relation to the reading cell MCA that stores shifted data.

As such, in the read sequence, the shift operation and the read operation are repeatedly performed.

<Time T9a>

After a predetermined number of times of read cycle is performed, at time T9a, the reading circuit 150 stops the supply of the current $|I_{BL-WL}|$ to the selected memory cell unit. The current value of the current $|I_{BL-WL}|$ is set to zero. Accordingly, the switching element 20 is set to the off state.

As a result, the selected memory cell unit is set to the deactivation state (non-selected state, the off state).

Accordingly, for the domain wall memory of the first embodiment, the read sequence is completed.

[Write Sequence]

FIG. 14 illustrates an example of an operation sequence (write sequence) including the shift operation and the write operation in the domain wall memory of the present embodiment.

In FIG. 14, the horizontal axis of the graph corresponds to the time, and the vertical axis of the graph corresponds to the current value (absolute value) of the current ($|I_{BL-WL}|$) flowing between the bit line and the word line. FIG. 14 illustrates a current (the write current PWR) flowing the write wiring. The write current has the positive polarity (the positive current value) or the negative polarity (the negative current value) according to the direction flowing the write wiring WRL.

<Time T0b, T1b, and T2b>

The external device 2 sends a write command, an address of a data writing target, and data (write data) to be written in the memory cell array 100 to the domain wall memory 1 of the embodiment.

For example, at time T0b, the domain wall memory 1 receives a write command, a selected address, and write data.

The domain wall memory 1 starts the write sequence of the data with respect to the memory cell unit (selected memory cell unit) corresponding to the selected address based on the write command.

For example, by the write command, the data is continuously written in a plurality of memory cells in the selected memory cell unit.

As illustrated in FIG. 14, in the same manner as in the read sequence, at time T1b, the switching current Pa is supplied to the selected bit line BL. Accordingly, the selected memory cell unit MU is electrically connected to the selected bit line BL via the switching element 20 in the on state.

After the supply of the switching current Pa (for example, time T2b), the current value of the current supplied to the selected memory cell unit MU is set to be equal to or larger than the current value i1 of the hold current IHD of the switching element 20.

<Time T3b and T4b>

After the selected memory cell unit MU is set to the activation state, the shift operation of the first cycle in the write sequence starts. The shifting circuit 160 supplies the shift current SP to the selected memory cell unit MU.

The shift pulse SP of the shift operation of the write sequence is substantially the same as the shift pulse SP of the shift operation of the read sequence. Here, in the write operation of the domain wall memory in a LIFO (last in, first out) method, the shift current SP is supplied to the selected memory cell unit MU, for example, to flow from the word line WL to the bit line BL.

At time T3b, the main pulse P1 of the shift current SP is supplied to the selected memory cell unit. The main pulse P1 has the current value ia. The main pulse P1 has the pulse width $t_{p1}$.

In the period corresponding to the pulse width $t_{p1}$, the pulse P1 is supplied to the magnetic body 50. Accordingly, all of the domain walls in the magnetic body 50 move in the moving direction (here, the direction is from the bit line side to the word line side) of the electrons.

For example, by the shift operation of the write sequence, the magnetic domain (magnetization) is shifted by one bit from the memory cell (for example, the writing cell MCA) on the upper end side (bit line side) of the selected memory cell unit MU to the memory cell MC on the lower end side (word line side) of the selected memory cell unit MU.

By the supply of the main pulse P1, the presence probability of the position of the domain wall in the constriction area AR1 reaches the state illustrated in FIG. 10A.

For example, at time T4b, the shifting circuit 160 stops the supply of the main pulse P1. Accordingly, the current $|I_{BL-WL}|$ is set to the current value i1.

<Time T5b and T6b>

After the relaxation time $t_{rx1}$ elapses from the stop of the supply of the main pulse P1, at time T5b, the adjustment pulse P2 of the shift current SP is supplied to the selected memory cell unit MU. The adjustment pulse P2 has the current value ia. The adjustment pulse P2 has the pulse width $t_{p2}$.

At time t6b, the shifting circuit 160 decreases the current value of the supplied current $|I_{BL-WL}|$ from the current value ia to the current value i1.

By the supply of the adjustment pulse P2, the domain wall DW has the distribution of the presence probability illustrated in FIG. 10B and can be present in the constriction area AR1.

As illustrated in FIG. 10C, in a certain period (relaxation time) $t_{rx2}$ from the stop of the supply of the adjustment pulse P2, the position of the domain wall DW is shifted to the inside of the constriction area AR1 (or a portion near the constriction area AR1).

Accordingly, in the present embodiment, the variation of the position of the domain wall after the supply of the shift current SP is reduced.

As such, the shift operation in the first writing cycle of the write sequence is completed.

<Time T7b and T8b>

In the write sequence, subsequent to the shift operation, the write operation is performed in relation to the selected memory cell unit MU.

For example, at time T7b, the writing circuit 140 supplies the write current PWR to the write wiring WRL. The write current PWR flows in the write wiring WRL. Accordingly, the magnetic field occurs around the write wiring WRL. The direction of the magnetic field depends on the direction of flowing the write current PWR.

The direction in which the write current PWR flows is set according to the write data (data of "1" or data of "0"). For example, when the write current (for example, the write current having the positive current value) having the first polarity is supplied to the write wiring WRL, data of "1" is written in the writing cell. For example, when the write current (for example, the write current having the negative current value) having the second polarity different from the first polarity is supplied to the write wiring WRL, data of "0" is written in the writing cell.

The magnetic field from the write wiring WRL is applied to the magnetic layer 59. The direction of the magnetization of the magnetic layer 59 is set to the direction according to the direction of the magnetic field.

The magnetization of the magnetic layer 59 works on the magnetization (magnetic domain) of the writing cell MCA. The direction of the magnetization of the writing cell MCA is the same as the direction of the magnetization of the magnetic layer 59.

Accordingly, the write data is written in the writing cell MCA in the selected memory cell unit MU.

As such, the write operation in the first writing cycle of the write sequence is completed.

Subsequent to the first writing cycle, the second writing cycle is performed.

Same as the first writing cycle, the shift operation in the second writing cycle is performed. By the shift operation, the data in the writing cell is shifted to the next adjacent memory cell.

In the first writing cycle, when the domain wall DW moves by the shift operation using the shift current according to the present embodiment, the variation of the position of the domain wall DW in the constriction area AR1 is small. Therefore, in the shift operation in the second writing cycle, the variation of the position of the shifted domain wall DW becomes small.

As a result, in the domain wall memory of the present embodiment, the shift error in the write sequence is reduced.

As such, in the write sequence, the shift operation and the write operation are repeatedly performed.

<Time T9b>

After a predetermined number of times of the writing cycle is performed, at time T9b, the current value of the current $|I_{BL-WL}|$ is set to zero. Accordingly, the switching element 20 is set to the off state.

As a result, the selected memory cell unit is set to the deactivation state (non-selected state, the off state).

Accordingly, the write sequence is completed.

(d) Summary

In the shift operation of the domain wall memory, the domain wall in the magnetic body moves in the magnetic body by the shift pulse.

When the domain wall moves in the magnetic body having the constriction structure, since the domain wall has a width of a certain size, the volume change rate of the domain wall becomes small in a portion where the volume in the magnetic body of the constriction structure becomes the maximum value and/or a portion (and the vicinity area thereof) where the volume becomes the minimum value. Resulting from the volume change rate of the domain wall, the domain wall hardly moves.

Therefore, in the shift operation, it is likely that the domain wall may not be present at a target position.

As a result, in the domain wall memory, it is likely that the shift error of the domain wall (magnetic domain) may increase.

In the domain wall memory of the present embodiment, the shift pulse (shift current) includes a plurality of pulses. According to the present embodiment, during the shift operation, two pulses having two different pulse waveforms are supplied to the magnetic body of the constriction structure with a certain period interposed therebetween.

The domain wall memory of the present embodiment supplies the first pulse and moves the domain wall in the constriction area to the adjacent constriction area in the flowing direction of the shift current.

The domain wall memory of the present embodiment supplies the second pulse after the elapse of a certain period from the supply of the first pulse.

Accordingly, together with the adjustment of the position of the domain wall, in the relaxation time after the supply of the adjustment pulse, the domain wall is shifted to the area having a smaller volume of the magnetic body.

Therefore, the presence probability of the domain wall converges to the comparatively narrow distribution in the constriction area (or the vicinity area thereof).

As a result, the domain wall memory of the first embodiment can prevent the occurrence of the shift error in the operation sequence including one or more shift operations.

Accordingly, the magnetic memory of the first embodiment can improve the reliability of the operation.

(2) Second Embodiment

Figure 15:
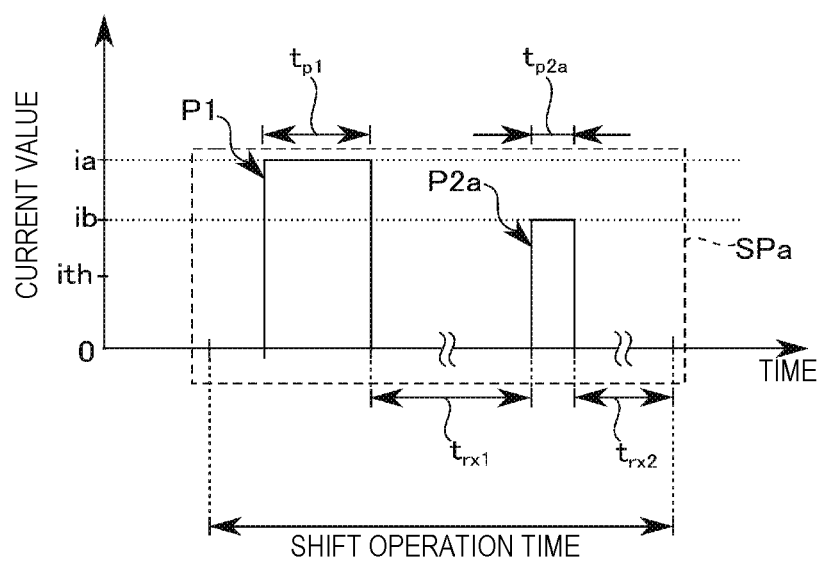
FIG. 15 is a diagram illustrating aspects of a magnetic memory according to a second embodiment.
Figure 16:
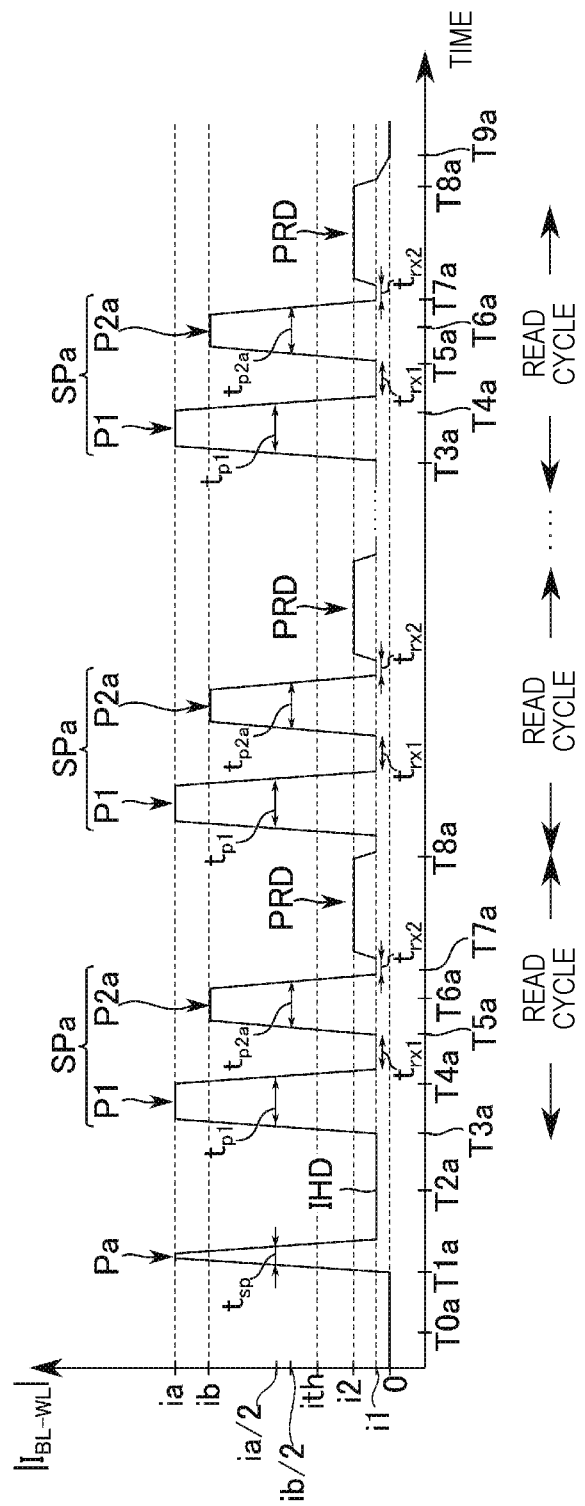
FIG. 16 is a diagram illustrating aspects an operation example of a magnetic memory according to a second embodiment.

With reference to FIGS. 15 and 16, a magnetic memory of the second embodiment and a control method thereof are described.

FIG. 15 is a waveform diagram indicating a pulse waveform of a shift pulse used in a shift operation of a magnetic memory (for example, a domain wall memory) of the present embodiment.

As illustrated in FIG. 15, relating to a shift current (shift pulse) SPa, the current value ia of the pulse P1 may be different from a current value ib of a pulse P2a.

For example, the current value ia is larger than the current value ib. The current value ib is lower than the current value ia and equal to or larger than the threshold $i_{th}$.

The amount of movement of the domain wall DW can be set according to the current value ($>i_{th}$) and the pulse width (supply time of the current) of the current. For example, according to the reduction of the current value of the shift current, the amount of movement of the domain wall decreases.

When the current value ib of the adjustment pulse P2a is larger than the domain wall shift threshold $i_{th}$ and smaller than the current value ia, considering the amount of movement of the domain wall DW by the adjustment pulse P2a, a pulse width $t_{p2a}$ of the adjustment pulse P2a may be set to the size equal to or larger than the pulse width $t_{p1}$ of the main pulse P1.

When the shift current SPa of the pulse waveform of FIG. 15 is used for the shift operation of the domain wall memory 1, the presence probability of the domain wall DW can have the comparatively narrower distribution in the constriction areas AR1 (or the vicinity area thereof) same as in the examples of FIGS. 10A to 10C.

FIG. 16 is a timing chart illustrating an operation example of the domain wall memory of the present embodiment. FIG. 16 illustrates an example of the read sequence of the domain wall memory of the present embodiment.

As illustrated in FIG. 16, same as in the read sequence of FIG. 13, the read sequence starts based on the read command and the selected address. The switching element 20 is set to the on state. Accordingly, the selected memory cell unit MU is electrically connected to the bit line BL.

As described above, in the read sequence, the shift operation and the read operation are repeatedly performed.

According to the present embodiment, the current value ib of the adjustment pulse P2a is different from the current value ia of the main pulse P1. The current value ib ($>i_{th}$) is smaller than the current value ia.

The pulse width $t_{p2a}$ of the adjustment pulse P2a is set to the same size as the pulse width $t_{p1}$ of the main pulse P1.

According to the present embodiment, when the pulse widths of the two pulses P1 and P2a of the shift current SPa are the same, the configuration of the circuit and the control of the circuit used for the shift operation can be simplified.

The write sequence of the domain wall memory of the present embodiment is performed by using the shift current of FIG. 15 in substantially the same manner as the above example (for example, FIG. 14) of the write sequence.

Accordingly, the magnetic memory of the second embodiment can obtain the same effects as the first embodiment.

(3) Third Embodiment

Figure 17:
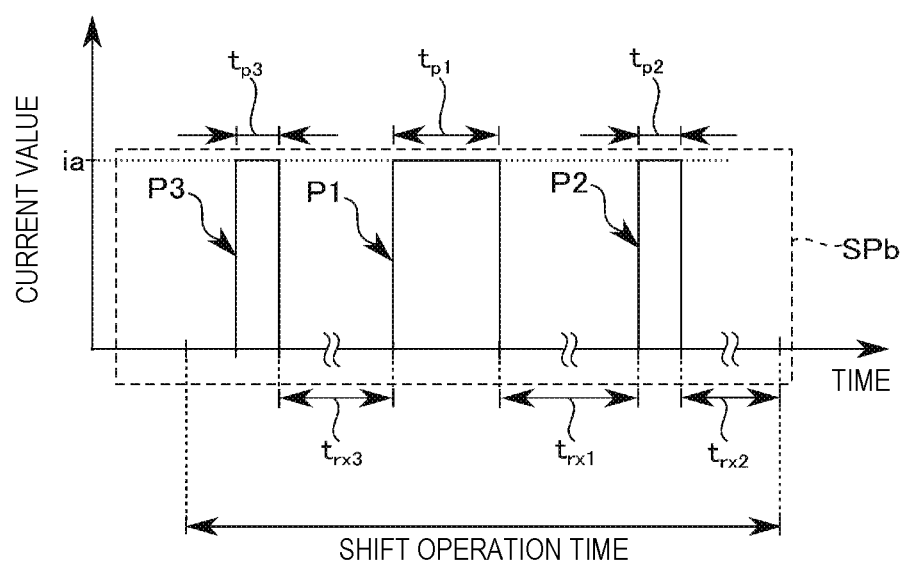
FIG. 17 is a diagram illustrating aspects of a magnetic memory according to a third embodiment.
Figure 18A:
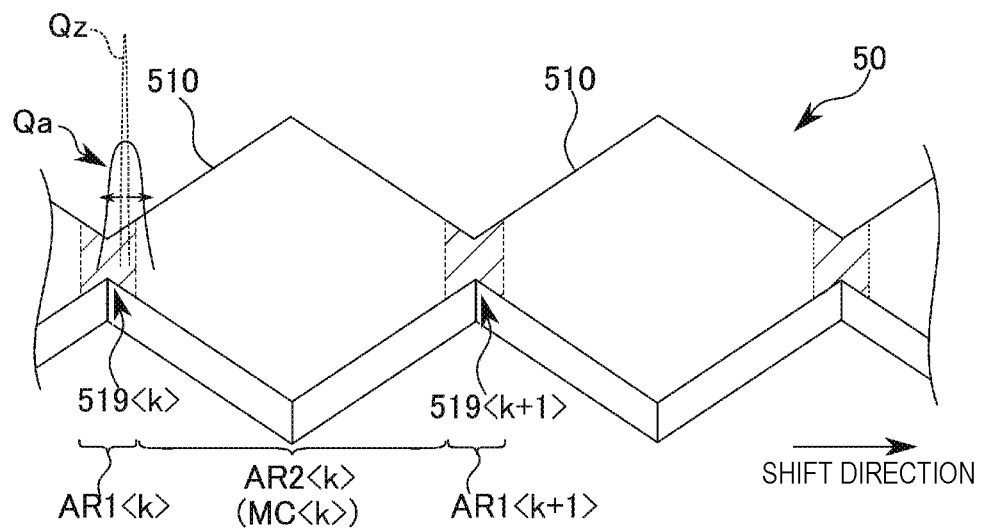
FIGS. 18A and 18B are diagrams illustrating aspects of a magnetic memory according to a third embodiment.
Figure 18B:
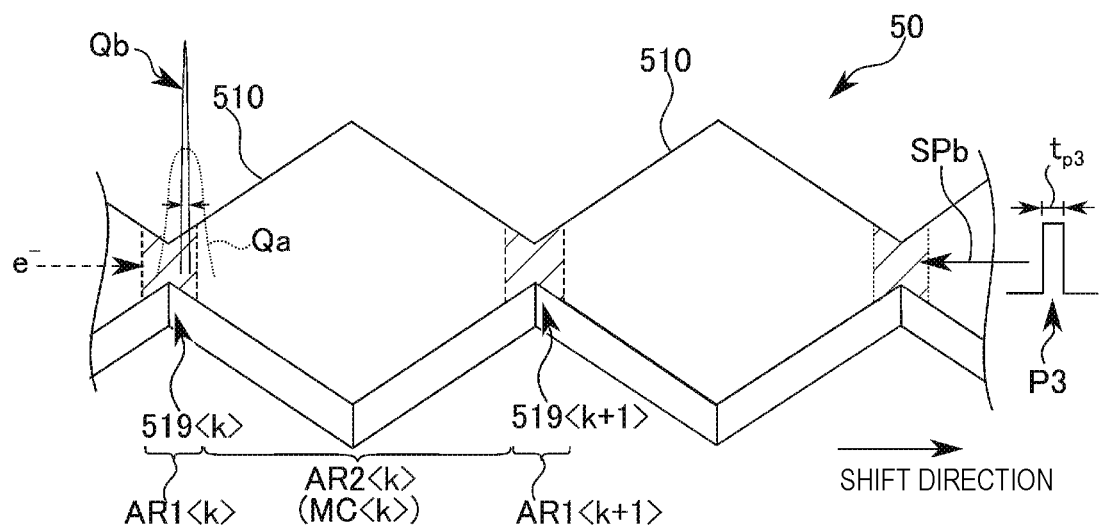

With reference to FIGS. 17 to 18B, the magnetic memory of the third embodiment and the control method thereof are described.

FIG. 17 is a waveform diagram illustrating a pulse waveform of a shift pulse used for the shift operation of the magnetic memory (for example, the domain wall memory) of the present embodiment.

As illustrated in FIG. 17, according to the present embodiment, a shift current (shift pulse) SPb may include three or more pulses P1, P2, and P3.

The main pulse P1 is provided between the two pulses P2 and P3.

The pulses P1, P2, and P3 have the current values equal to or larger than the domain wall shift threshold $i_{th}$. For example, the current values of the pulses P1, P2, and P3 are the same. Here, the current values of the three pulses P1, P2, and P3 may be different from each other.

A pulse width $t_{p3}$ of the pulse P3 is smaller than the pulse width $t_{p1}$ and equal to or larger than the pulse width $t_{p2}$. Here, the pulse width $t_{p3}$ may be smaller than the pulse width $t_{p2}$.

In the shift operation using the shift current SPb of FIG. 17, before the pulse P1 having the pulse width $t_{p1}$, the pulse P3 having the pulse width $t_{p3}$ smaller than the pulse width $t_{p1}$ is supplied to the magnetic body 50.

FIGS. 18A and 18B are schematic views illustrating an operation example of the domain wall memory of the present embodiment.

For example, when the memory cell unit (magnetic body) is not activated over a long period, it is likely that the position of the domain wall DW changes.

Therefore, as illustrated in FIG. 18A, it is likely that the distribution of the presence probability of the domain wall changes over time to distribution Qa wider than distribution Qz immediately after the shift operation.

According to the present embodiment, when the adjustment pulse P3 is supplied to the magnetic body 50 before the supply of the pulse P1, as illustrated in FIG. 18B, the domain wall is shifted in the constriction area AR1 and in an area near a boundary between the constriction area AR1 and the cell area AR2.

In the relaxation time from the stop of the supply of the adjustment pulse P3 to the start of the supply of the main pulse P1, the domain wall is shifted to a magnetic area having a smaller volume.

As a result, the position of the domain wall DW is adjusted to converge on the constriction area AR1 in the magnetic body 50 or in an area near a boundary between the constriction area AR1 and the cell area AR2. Accordingly, the presence probability of the domain wall DW can have comparatively narrow distribution Qb.

After the supply of the adjustment pulse P3, as described above (for example, see FIGS. 10A to 10C), the domain wall is shifted by the main pulse P1. After the shift of the domain wall between constriction areas, the position of the domain wall in the constriction area of the movement destination is adjusted by the adjustment pulse P2.

According to the present embodiment, in the operation sequence in which a plurality of operations are repeatedly performed at a comparatively short cycle like the above read and write sequence, the adjustment pulse P3 is supplied before the supply of the main pulse P1. Here, before the effective movement of the domain wall DW by the main pulse P1, the position of the domain wall DW in the constriction area AR1 is adjusted.

As a result, the variation of the position of the domain wall shifted by the main pulse P1 is reduced.

Accordingly, by the adjustment pulse P3 supplied before the main pulse P1, the shift of the domain wall DW by the pulse P1 and the adjustment of the position of the domain wall DW by the pulse P2 can be highly precisely performed.

According to the present embodiment, when the current value of the pulse P3 is smaller than the current values of the pulses P1 and P2, according to the amount of movement of the domain wall by the pulse P3, the pulse width $t_{p3}$ may be set to be smaller than the pulse width $t_{p2}$ or be equal to or larger than the pulse width $t_{p2}$.

The magnetic memory of the third embodiment can obtain the same effects as the other embodiments.

(4) Fourth Embodiment

Figure 19:
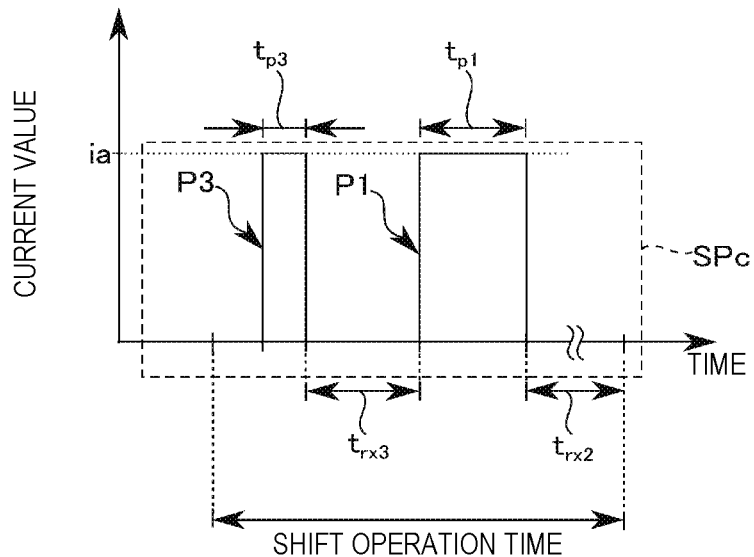
FIG. 19 is a diagram illustrating aspects of a magnetic memory according to a fourth embodiment.

With reference to FIG. 19, a magnetic memory of a fourth embodiment and a control method thereof are described.

FIG. 19 is a waveform diagram illustrating a pulse waveform of a shift pulse used in a shift operation of the magnetic memory (for example, the domain wall memory) of the fourth embodiment.

As illustrated in FIG. 19, the adjustment pulse P3 may be supplied to the magnetic body 50 only before the supply of the main pulse P1. According to the present embodiment, the adjustment pulse is not supplied to the magnetic body 50 after the supply of the pulse P1.

After the position of the domain wall DW is adjusted, the domain wall DW moves between the constriction areas AR1 via the cell area AR2.

By the adjustment of the position of the domain wall DW before the movement of the domain wall DW, the variation of the position of the domain wall DW after the supply of the pulse P1 is comparatively reduced, for example, as illustrated in FIG. 10C.

As a result, the magnetic memory of the fourth embodiment can obtain the same effects as the above embodiments.

(5) Fifth Embodiment

Figure 20:
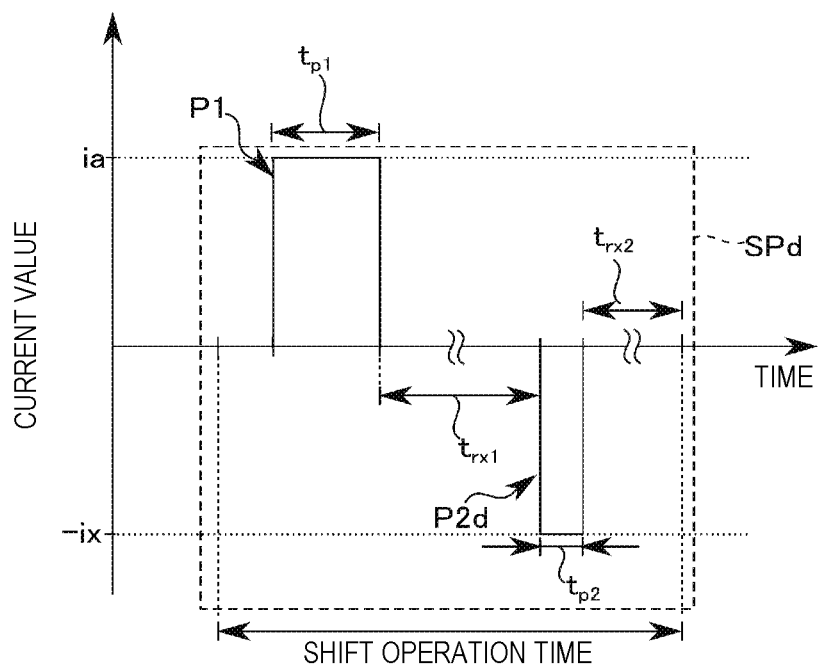
FIG. 20 is a diagram illustrating aspects of a magnetic memory according to a fifth embodiment.
Figure 21A:
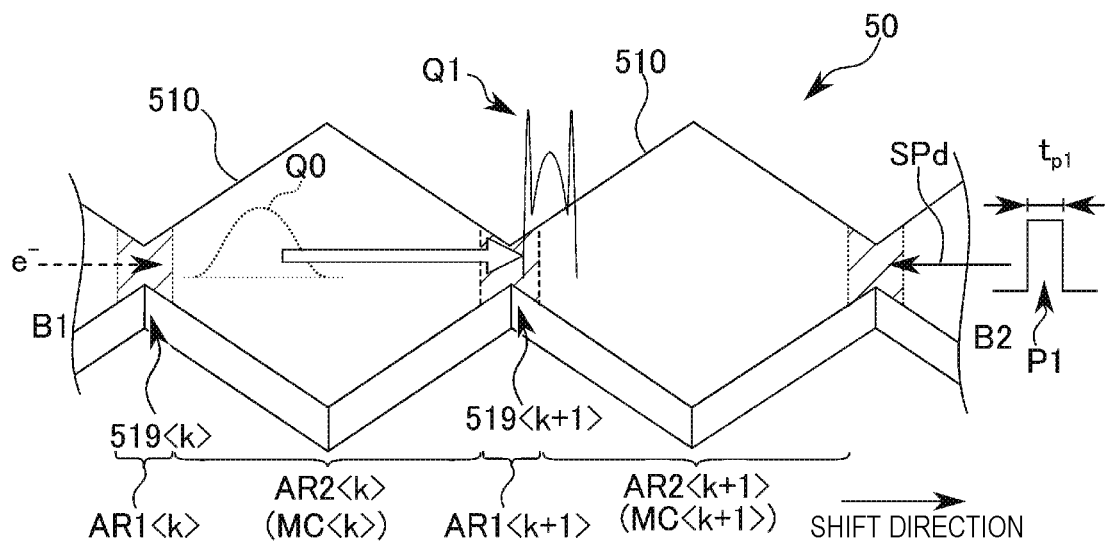
FIGS. 21A and 21B are diagrams illustrating aspects of a magnetic memory according to a fifth embodiment.
Figure 21B:
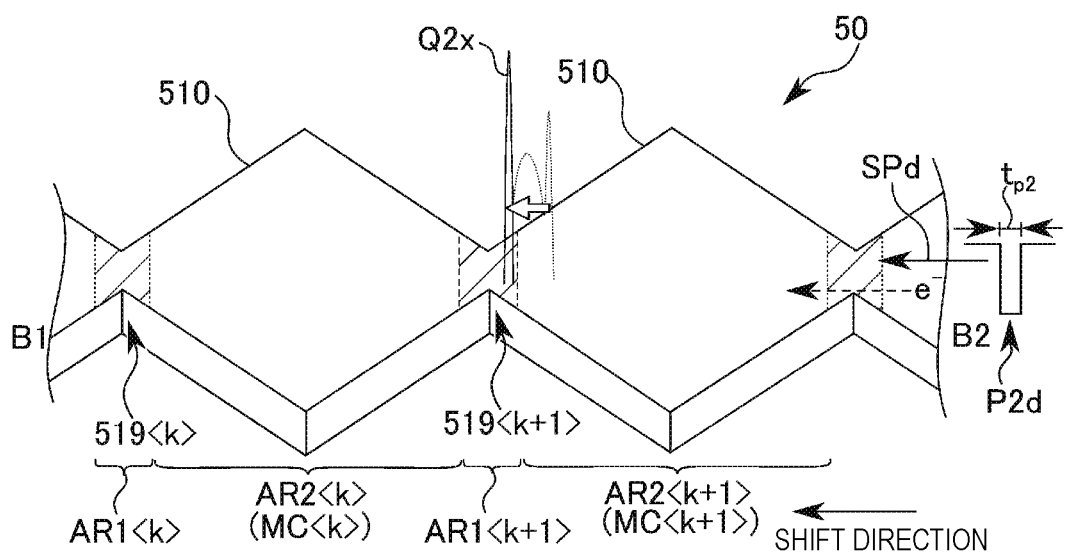

With reference to FIGS. 20 to 21B, a magnetic memory of the fifth embodiment and the control method thereof are described.

FIG. 20 is a waveform diagram illustrating a pulse waveform of a shift pulse used for a shift operation of the magnetic memory (for example, the domain wall memory) of the present embodiment.

As illustrated in FIG. 20, a shift pulse (shift current) SPd may also include the plurality of current pulses P1 and P2$d$ having the different polarity.

The main pulse P1 has the positive current value ia. The adjustment pulse P2$d$ has a negative current value $-$ix.

An absolute value |ix| of the current value of the adjustment pulse P2$d$ is an absolute value |ia| of the current value of the main pulse P1 or lower and an absolute value |ith| of a domain wall shift threshold or higher.

The direction (the moving direction of the electron e$^-$) in which the adjustment pulse P2$d$ flows in the magnetic body 50 is opposite in relation to the direction in which the main pulse P1 flows in the magnetic body 50. The moving direction of the electron e$^-$ during the supply of the adjustment pulse P2$d$ is opposite in relation to the moving direction of the electron e$^-$ during the supply of the main pulse P1.

FIGS. 21A and 21B are schematic views illustrating a state in which a domain wall moves during the shift operation in the domain wall memory of the present embodiment.

As illustrated in FIG. 21A, by the supply of the main pulse P1, the domain wall DW moves from one end side (B1 side) of the magnetic body 50 to the other end side (B2 side) of the magnetic body 50. Accordingly, the domain wall DW can be disposed in the presence probability illustrated in the distribution Q1 in the constriction area AR1 <k+1> of the movement destination.

As illustrated in FIG. 21B, after the supply of the main pulse P1, the domain wall DW moves by the supply of the adjustment pulse P2$d$ from the other end side (B2 side) of the magnetic body 50 to one end side (B1 side) of the magnetic body 50.

The domain wall DW moving to the other end B2 side of the magnetic body 50 by the main pulse P1 returns to the one end B1 side of the magnetic body 50 by the adjustment pulse P2$d$.

By the supply of the adjustment pulse P2$d$, like distribution Q2$x$ of the presence probability of the domain wall DW, the position of the domain wall DW is adjusted to converge on the range of the constriction area AR1 including the recess portion 519.

As such, the magnetic memory of the fifth embodiment can obtain the same effects as the above embodiments.

(6) Modification Example

With reference to FIGS. 22 to 26, a modification example of the magnetic memory of the fifth embodiment is described.

Figure 22:
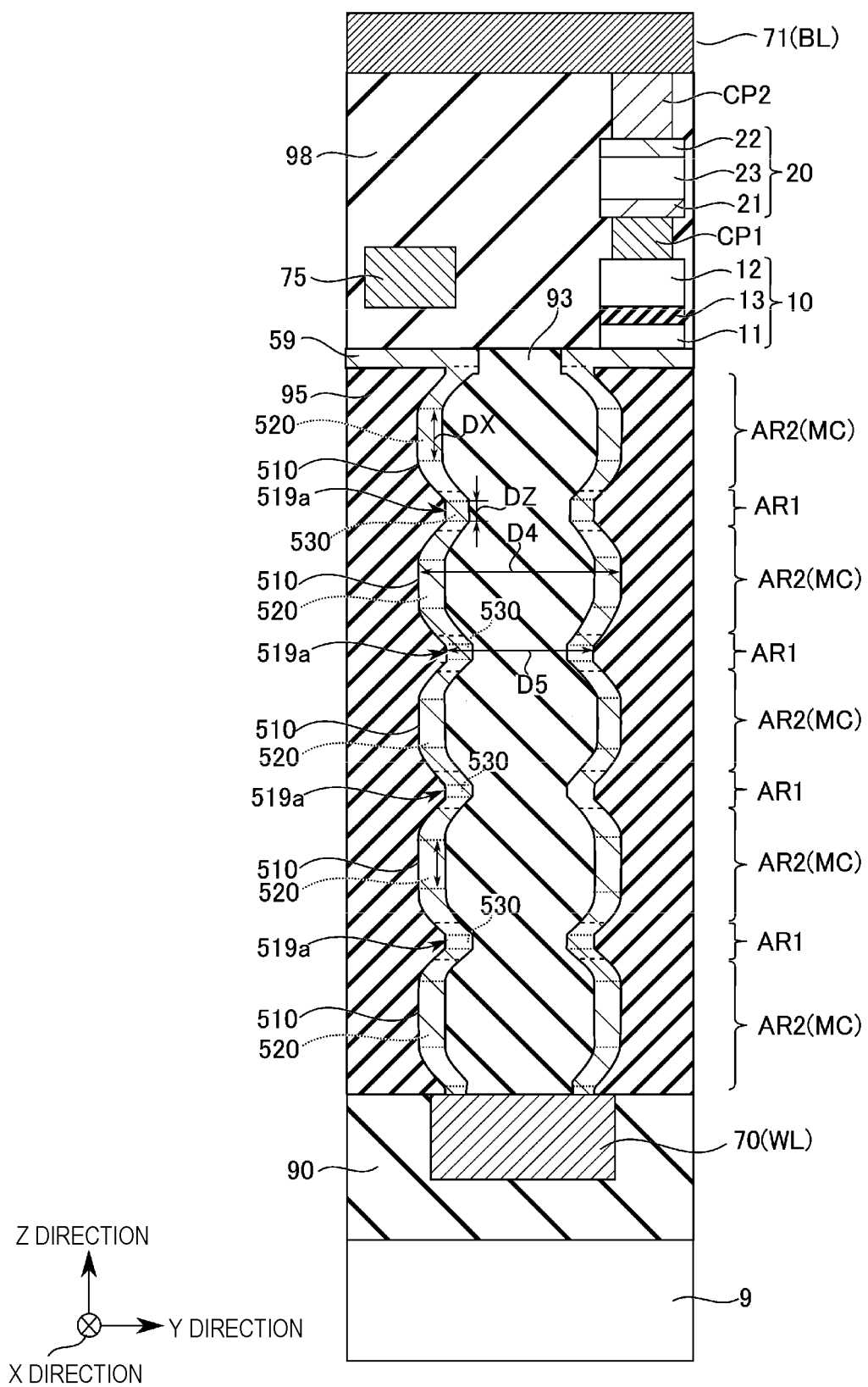
FIG. 22 cross-sectional view illustrating aspects of a modification example of a magnetic memory according to a fifth embodiment.

FIG. 22 is a schematic view illustrating a modification example of a magnetic body in a memory cell unit of the magnetic memory of the fifth embodiment.

As illustrated in FIG. 22, the magnetic body 50 may include portions 520 and 530 each having certain dimensions in the intersecting direction in relation to the moving direction of the domain wall which do not change.

For example, in the tubular magnetic body 50, the portions 520 are provided in the cell areas AR2. The portions 520 are included in the protrusions (cell portions) 510.

The portion 520 has dimension DX in the moving direction (here, the Z direction) of the domain wall. The portion 520 has dimension (diameter) D4 in a direction (here, parallel direction in relation to the front surface of the substrate 9, for example, the X direction or the Y direction) intersecting to the moving direction of the domain wall. The dimension D4 of the portion 520 is substantially constant in the Z direction.

The portions 530 are provided in the constriction areas AR1. The portions 530 are included in recess portions (constriction portions) 519$a$ having a certain dimension (volume).

The portion 530 has a dimension DZ in the Z direction. The portion 530 has a dimension (diameter) D5 in the parallel direction in relation to the front surface of the substrate. The dimension D5 of the portion 530 is substantially constant in the Z direction.

For example, the dimension D5 is smaller than the dimension D4. For example, the dimension DZ is smaller than the dimension DX.

Between the portions 520 and the portions 530, dimensions in the parallel direction in relation to the substrate front surface of the magnetic body 50 decrease or increase.

Figure 23:
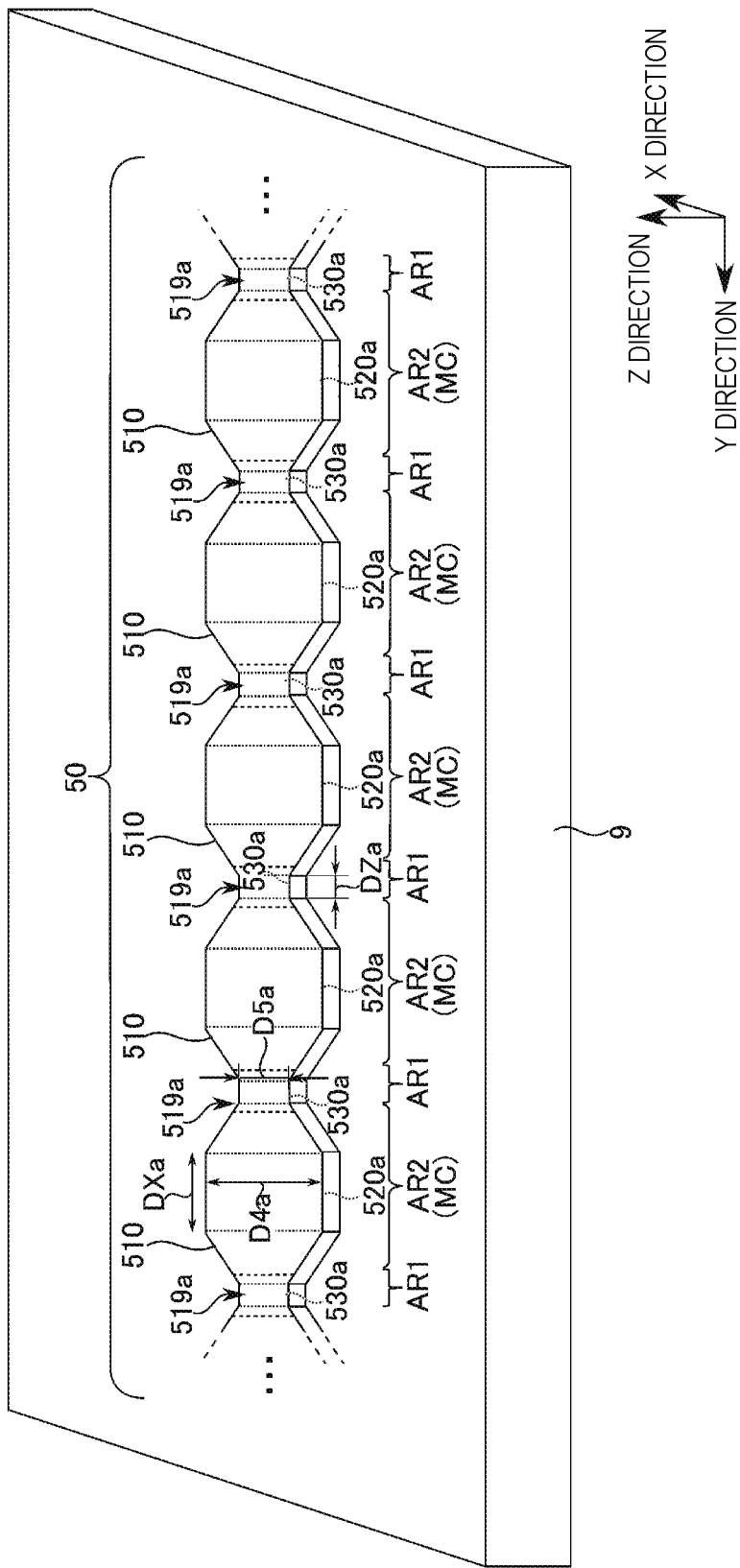
FIG. 23 is a diagram illustrating aspects of a modification example of a magnetic memory according to a fifth embodiment.

FIG. 23 is a schematic view illustrating a modification example of the magnetic body in the memory cell unit of the domain wall memory of the embodiment.

As illustrated in FIG. 23, portions 520$a$ having the constant dimension D4$a$ in the cell areas AR2 of the plate-shaped magnetic layer 50 may be provided. Portions 530$a$ having constant dimension D5$a$ may be provided in the constriction areas AR1 of the plate-shaped magnetic body 50.

The portion 520$a$ has dimension DXa in the moving direction of the domain wall. The portion 530$a$ has dimension DZa in the moving direction of the domain wall.

The dimension D4$a$ of the portion 520$a$ and the dimension D5$a$ of the portion 530$a$ are substantially constant in the moving direction of the domain wall.

For example, the dimension D5$a$ is smaller than the dimension D4$a$. For example, the dimension DZa is smaller than the dimension DXa.

Even when the magnetic body (domain wall moving layer) 50 of the memory cell unit has the structure of FIG. 22 or 23, the effect substantially the same as the effects of the domain wall memories of the above embodiments can be obtained.

Figure 24:
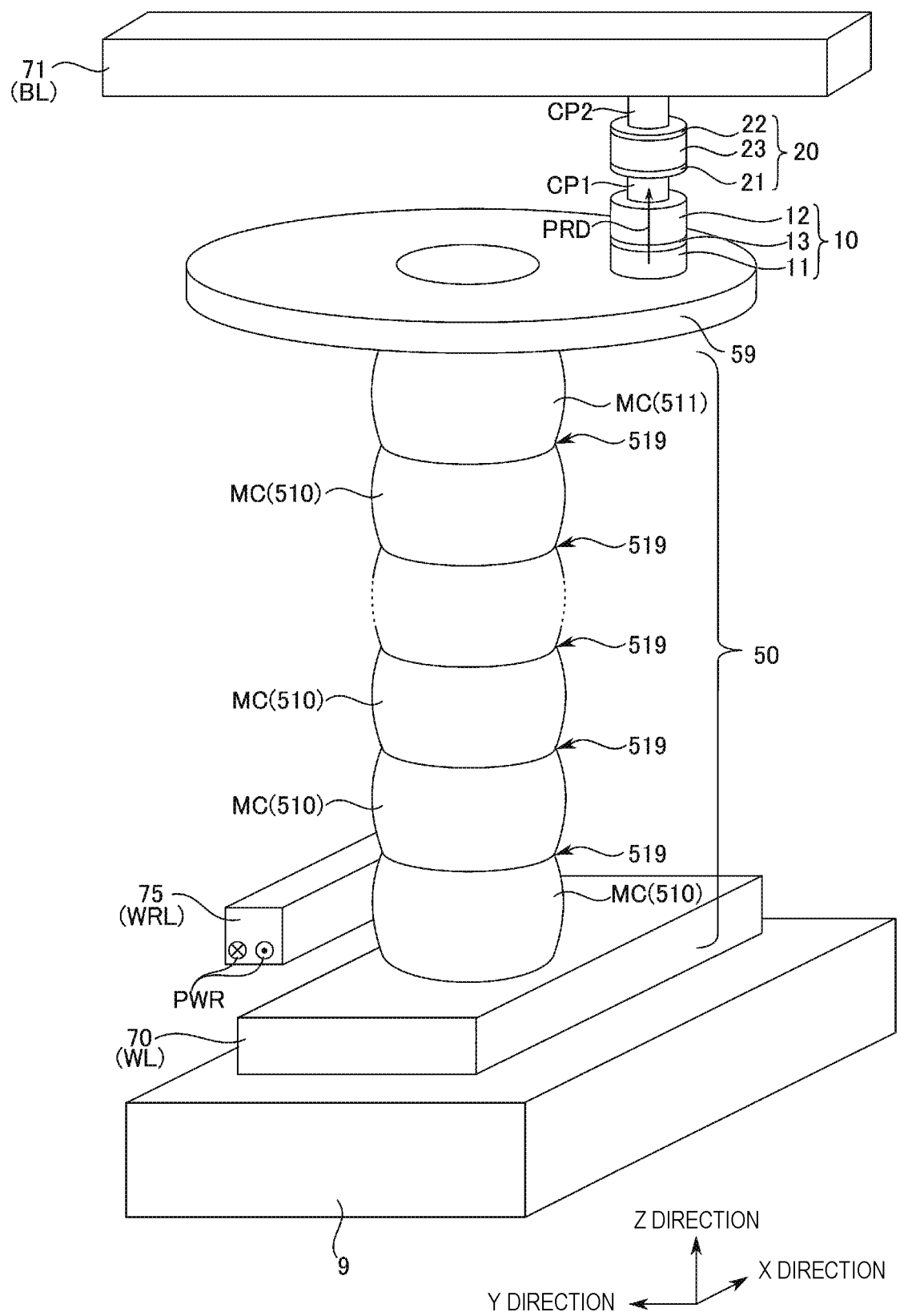
FIG. 24 is a perspective view illustrating aspects of a modification example of a magnetic memory according to a fifth embodiment.

FIG. 24 is a schematic view illustrating a modification example of the memory cell array of the domain wall memory of the embodiment.

As illustrated in FIG. 24, the write wiring WRL for writing data may be provided on a word line side.

For example, in the memory cell array including the magnetic body 50 extending in the Z direction, the write wiring WRL is provided on the lower end side of the magnetic body 50.

The memory cell on the most word line side of the magnetic body 50 is used as a writing cell. Here, the memory cell on the most bit line side of the magnetic body is used as a reading cell without being used as a writing cell.

For example, the write wiring WRL is adjacent to a writing cell on the lower end side of the magnetic body 50 in the Y direction.

The magnetic field resulting from the write current supplied to the write wiring WRL is applied to the writing cell. The direction of the magnetization in the writing cell is set according to the direction of the magnetic field. Accordingly, data is written in the writing cell.

During the writing and the reading of the data, the data in the memory cell is shifted from the word line side to the bit line side.

For example, the domain wall memory having the memory cell unit of FIG. 24 functions as a domain wall shift memory (for example, a shift register) of a first-in, first-out (FIFO) method.

Figure 25:
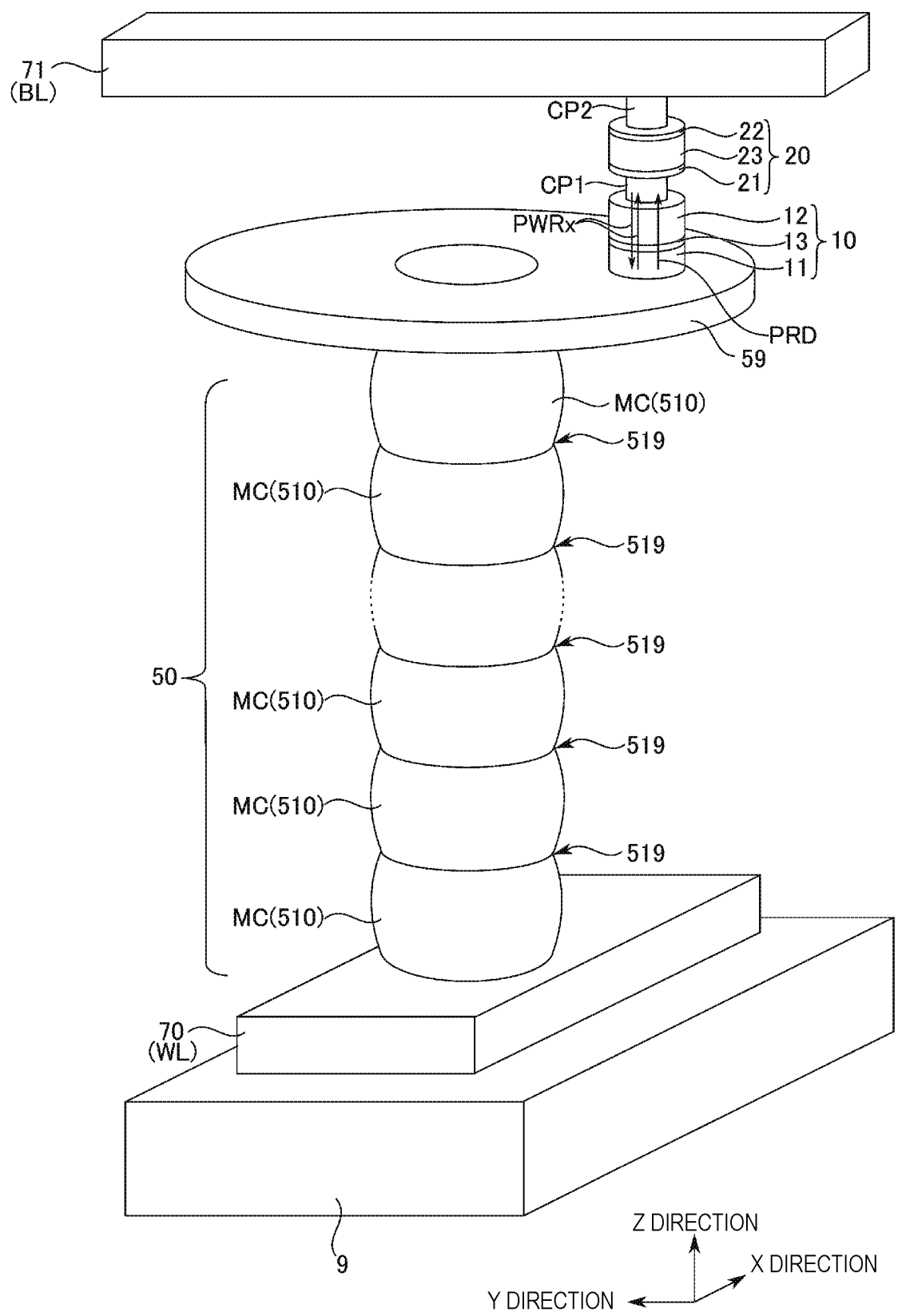
FIG. 25 is a perspective view illustrating aspects of a modification example of a magnetic memory according to a fifth embodiment.

FIG. 25 is a schematic view illustrating a modification example of the memory cell array of the domain wall memory of the embodiment.

With respect to the domain wall memory of FIG. 25, data is written in the magnetic body 50 by the STT method.

The MTJ element 10 on the magnetic layer 59 is used as a recording element (writing element) together with being used as a reproducing element.

Here, the write wiring for a magnetic field writing method is not provided in the memory cell array 100.

During the write operation, a write current (writing pulse) PWRx is supplied to the MTJ element 10. According to the data written to the writing cell, the write current PWRx flows in the direction from the bit line BL to the word line WL or flows in the direction from the word line WL to the bit line BL.

The directions of the magnetization in the storage layer 11 and the magnetic layer 59 are controlled by spin torque resulting from the write current PWRx flowing in the MTJ element 10. According to the direction of the magnetization of the magnetic layer 59, the direction of the magnetization of the writing cell is set.

Accordingly, the direction of the magnetization of the writing cell is controlled according to the write data.

As such, write data is written in the memory cell unit by writing of the data in the STT method.

The current value of the write current PWRx is larger than the current value of the read current PRD. In order to avoid an unintended shift operation by the write current PWRx and an unintended write operation by the shift current SP, the pulse shape (that is, at least one of the current value and the pulse width) of the write current PWRx is appropriately set.

For example, the domain wall memory of FIG. 25 functions as the domain wall shift memory (the shift register) in a LIFO (last in, first out) method.

Figure 26:
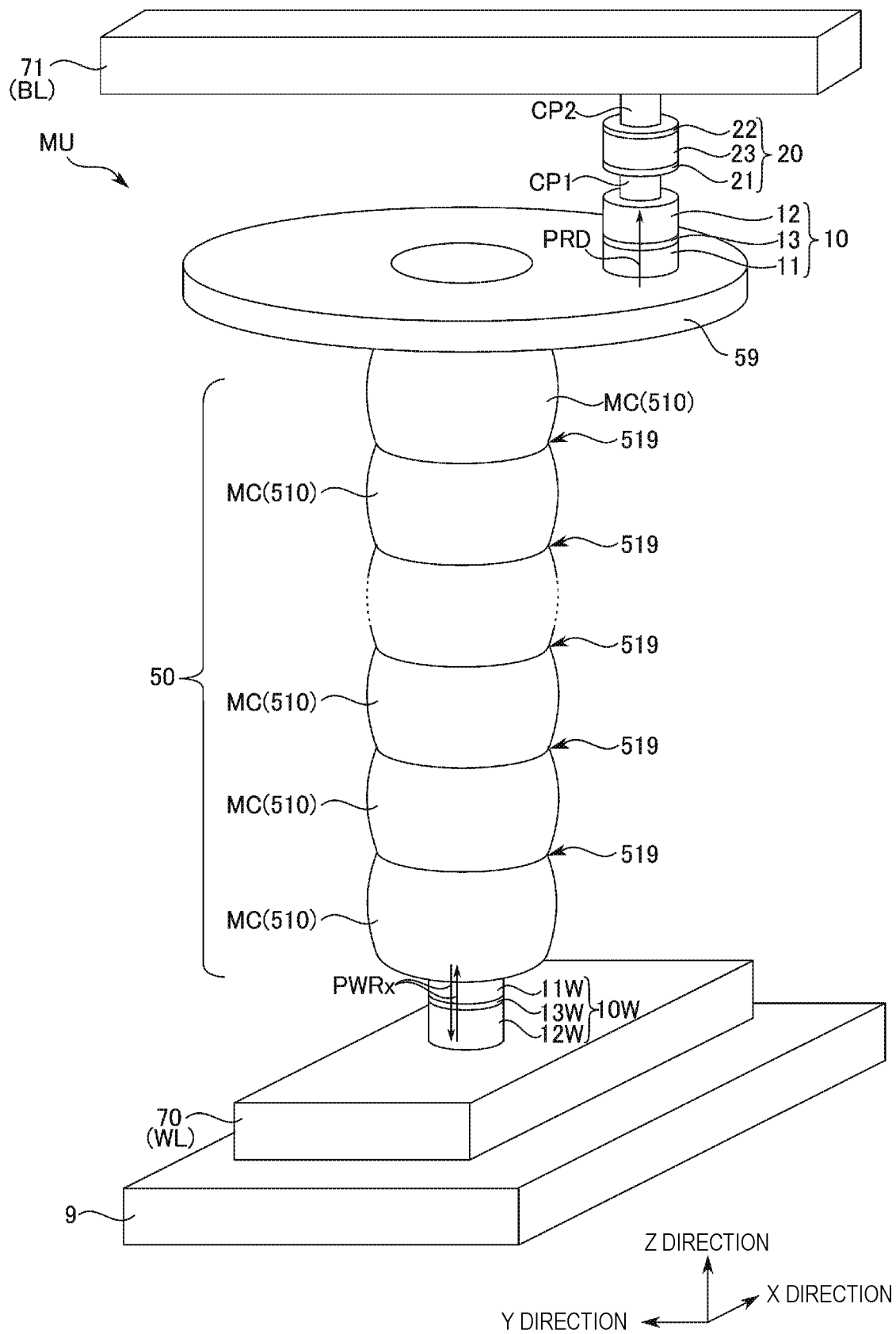
FIG. 26 is a perspective view illustrating aspects of a modification example of a magnetic memory according to a fifth embodiment.

FIG. 26 is a schematic view illustrating a modification example of the memory cell array of the domain wall memory of the embodiment.

As illustrated in FIG. 26, an MTJ element 10W for writing in the STT method may be provided on the lower end side (word line side) of the magnetic body 50.

The MTJ element 10W is provided between the magnetic body 50 and the word line WL.

The MTJ element 10W includes a storage layer 11W, a reference layer 12W, and a nonmagnetic layer (tunnel barrier layer) 13W. The storage layer 11W is provided between the word line WL and the lower end (bottom portion) of the magnetic body 50. The reference layer 12W is provided between the storage layer 11W and the word line WL. The tunnel barrier layer 13W is provided between the storage layer 11W and the reference layer 12W.

For example, the storage layer 11W is in direct contact with the magnetic body 50. Here, the magnetic layer may be provided between the storage layer 11W and the magnetic body 50. When the magnetic layer is provided between the storage layer 11W and the magnetic body 50, this magnetic layer is in direct contact with the storage layer 11W and the magnetic body 50.

The memory cell on the most word line side of the magnetic body 50 is used as the writing cell. Here, the memory cell on the most bit line side of the magnetic body is used only as the reading cell.

During the write operation, the write current flows between the MTJ element 10W and the magnetic body 50. The flowing direction of the write current depends on the data being written in the writing cell. The direction of the magnetization of the storage layer 11W is controlled by the spin torque resulting from the write current PWRx. According to the direction of the magnetization of the storage layer 11W, the direction of the magnetization of the writing cell can be set.

In order to provide reliability in view of the operation, the characteristics (for example, the magnetization reversal threshold of the storage layer) of the MTJ element 10W as the recording element may be different from the characteristics of the MTJ element 10 as the recording element.

For example, the domain wall memory of FIG. 26 functions as the domain wall shift memory (shift register) of a FIFO (first in, first out) method.

In the domain wall memories of the modification examples of FIGS. 24, 25, and 26, the magnetic bodies 50 may be plate-shaped magnetic layers.

In the shift operations of the domain wall memories of these modification examples, shift pulses (shift currents) including the plurality of pulses are used.

Accordingly, the domain wall memory of the modification example can obtain substantially the same effects as the domain wall memories of the above embodiments.

(7) Others

In the above embodiments, as the device using the shift operation of the domain wall in the magnetic body, a magnetic memory (for example, a domain wall memory or a domain wall shift memory) is provided. However, any device that can use a shift pulse (shift current) including a plurality of pulses as described in at least one embodiment for a shift operation of a domain wall in a magnetic body, then the present disclosure can be applied thereto and the present disclosure is not limited to magnetic memory.

A method of controlling the devices of the above embodiments is not limited to a shift operation of a domain wall in a magnetic memory. If the device is a device using a shift operation of a domain wall in a magnetic body, the methods of controlling the devices of the present disclosure may be applied to a method (operation) of controlling a device other than magnetic memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory, comprising:
  a magnetic body including:
    a first portion that has a first dimension in a first direction,
    a second portion that has the first dimension and spaced from the first portion in a second direction, and
    a third portion that has a second dimension, which is greater than the first dimension, in the first direction and is between the first portion and the second portion in the second direction; and a circuit configured to supply a shift pulse to the magnetic body to move a domain wall in the magnetic body along the second direction, wherein
the shift pulse comprises a first pulse and a second pulse,
the first pulse has a first pulse width,
the second pulse has a second pulse width less than the first pulse width,
the second pulse is after the first pulse;
a first current value of the first pulse is equal to or greater than a second current value of the second pulse,
the first pulse has a first polarity, and
the second pulse has a second polarity different from the first polarity.

2. The magnetic memory according to claim 1, wherein the first current value is greater than the second current value.

3. The magnetic memory according to claim 1, wherein the shift pulse further comprises a third pulse before the first pulse, and
the third pulse has a third pulse width less than the first pulse width.

4. The magnetic memory according to claim 1, wherein the circuit supplies a first current to the magnetic body in a period between the first pulse and the second pulse, and
the first current has a current value greater than zero but less than a current value of the first pulse.

5. The magnetic memory according to claim 1, wherein the magnetic body is on a substrate, and
the second direction is orthogonal to a surface of the substrate.

6. The magnetic memory according to claim 1, wherein the magnetic body is on a substrate, and
the second direction is parallel to a surface of the substrate.

7. A magnetic memory device, comprising:
a magnetic body including:
  a plurality of first portions that have each a first dimension in a first direction, the first portions being spaced from each other along a second direction intersecting the first direction, and
  a plurality of second portions that have each a second dimension in the first direction that is larger than the first dimension, each second portion being between an adjacent pair of first portions in the second direction; and
a circuit configured to supply a shift pulse to move a domain wall in the magnetic body along the second direction, wherein
the shift pulse comprises a first pulse and a second pulse,
the first pulse having a first pulse width,
the second pulse having a second pulse width that is less than the first pulse width,
the first pulse is supplied to the magnetic body before the second pulse is supplied to the magnetic body, and
a first current value of the first pulse is equal to a second current value of the second pulse.

8. The magnetic memory device according to claim 7, wherein
the shift pulse further comprises a third pulse that is before the first pulse, and
the third pulse has a third pulse width less than the first pulse width.

9. The magnetic memory device according to claim 7, wherein
the circuit supplies a first current to the magnetic body in a relaxation period between the first pulse and the second pulse, and
the first current has a current value greater than zero but less than a current value of the first pulse.

10. The magnetic memory device according to claim 7, wherein
the magnetic body is on a substrate, and
the second direction is orthogonal to a surface of the substrate.

11. The magnetic memory device according to claim 7, wherein
the magnetic body is on a substrate, and
the second direction is parallel to a surface of the substrate.

12. A magnetic memory storage device, comprising:
a plurality of word lines extending in a first direction;
a plurality of bit lines extending in a second direction;
a plurality of magnetic bodies extending in a third direction perpendicular to the first and second directions, each magnetic body extending between a bit line of the plurality of bit lines and a word line of the plurality of word lines and including:
  a first portion that has a first dimension,
  a second portion that has the first dimension and is spaced from the first portion in the third direction, and
  a third portion that has a second dimension and is between the first portion and the second portion in the third direction, the second dimension being greater than the first dimension; and
a circuit configured to supply a shift pulse to the plurality of magnetic bodies via the bit lines and word lines to move a domain wall of a magnetic body of the plurality of magnetic bodies along the third direction, wherein
the shift pulse comprises a first pulse and a second pulse,
the first pulse has a first pulse width,
the second pulse has a second pulse width less than the first pulse width,
the second pulse is after the first pulse,
the first pulse has a first polarity, and
the second pulse has a second polarity different from the first polarity.

13. The magnetic memory storage device according to claim 12, wherein
the shift pulse further comprises a third pulse before the first pulse, and
the third pulse has a third pulse width less than the first pulse width.

* * * * *